United States Patent
Kurokawa et al.

(10) Patent No.: US 9,006,635 B2
(45) Date of Patent: Apr. 14, 2015

(54) PHOTODETECTOR CIRCUIT AND SEMICONDUCTOR DEVICE

(71) Applicant: Semiconductor Energy Laboratory Co., Ltd., Atsugi-shi, Kanagawa-ken (JP)

(72) Inventors: Yoshiyuki Kurokawa, Kanagawa (JP); Takuya Tsurume, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 34 days.

(21) Appl. No.: 14/018,465

(22) Filed: Sep. 5, 2013

(65) Prior Publication Data
US 2014/0070079 A1    Mar. 13, 2014

(30) Foreign Application Priority Data
Sep. 12, 2012   (JP) .................... 2012-200495

(51) Int. Cl.
*H01L 27/00* (2006.01)
*H01L 27/144* (2006.01)
(Continued)

(52) U.S. Cl.
CPC ........ *H01L 27/144* (2013.01); *H01L 27/14603* (2013.01); *H04N 5/357* (2013.01); *H04N 5/3745* (2013.01); *H01L 27/14609* (2013.01); *H01L 27/14678* (2013.01)

(58) Field of Classification Search
USPC ........ 250/208.1, 214 R, 214 C, 214.1, 214 B; 348/294, 295, 297, 302, 303, 308
See application file for complete search history.

(56) References Cited

U.S. PATENT DOCUMENTS 5,731,613 A    3/1998    Yamazaki et al.
5,731,856 A    3/1998    Kim et al.
(Continued)

FOREIGN PATENT DOCUMENTS

EP    1 737 044 A1    12/2006
EP    2 226 847 A2    9/2010
(Continued)

OTHER PUBLICATIONS

Tanaka.K et al., "45.5: A System LCD with Optical Input Function using Infra-Red Backlight Subtraction Scheme,", SID Digest '10 : SID International Symposium Digest of Technical Papers, 2010, pp. 680-683.
(Continued)

*Primary Examiner* — Kevin Pyo
(74) *Attorney, Agent, or Firm* — Nixon Peabody LLP; Jeffrey L. Costellia

(57) ABSTRACT

To provide a photodetector circuit capable of obtaining signals in different periods without being affected by characteristics of a photoelectric conversion element. The photodetector circuit has n signal output circuits (n is a natural number of 2 or more) connected to the photoelectric conversion element. Further, the n signal output circuits each include the following: a transistor whose gate potential varies in accordance with the amount of light entering the photoelectric conversion element; a first switching element which holds the gate potential of the transistor; and a second switching element which controls a signal output from the transistor. Thus, after data based on the amount of light entering the photoelectric conversion elements is held as the gate potentials of the transistors, the second switching elements are turned on, whereby signals in different periods can be obtained without being affected by characteristics of the photoelectric conversion element.

21 Claims, 15 Drawing Sheets

(51) Int. Cl.
*H01L 27/146* (2006.01)
*H04N 5/357* (2011.01)
*H04N 5/3745* (2011.01)

(56) References Cited

U.S. PATENT DOCUMENTS

| | | | |
|---|---|---|---|
| 5,744,864 A | 4/1998 | Cillessen et al. |
| 6,025,607 A | 2/2000 | Ohori et al. |
| 6,198,799 B1 | 3/2001 | Ono et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,747,638 B2 | 6/2004 | Yamazaki et al. |
| 6,974,954 B2 | 12/2005 | Nagatsuka |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,271,835 B2 | 9/2007 | Iizuka et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,465,958 B2 | 12/2008 | Arao et al. |
| 7,468,304 B2 | 12/2008 | Kaji et al. |
| 7,501,293 B2 | 3/2009 | Ito et al. |
| 7,525,523 B2 | 4/2009 | Yamazaki et al. |
| 7,663,165 B2 | 2/2010 | Mouli |
| 7,674,650 B2 | 3/2010 | Akimoto et al. |
| 7,732,819 B2 | 6/2010 | Akimoto et al. |
| 7,745,798 B2 | 6/2010 | Takahashi |
| 8,461,545 B2 | 6/2013 | Imai |
| 8,492,728 B2 | 7/2013 | Antonuk |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0033016 A1 | 2/2006 | Ogawa et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0157760 A1 | 7/2006 | Hayashi et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0018075 A1 | 1/2007 | Cazaux et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0054319 A1 | 3/2008 | Mouli |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0072321 A1 | 3/2009 | Arao et al. |
| 2009/0073325 A1 | 3/2009 | Kuwabara et al. |
| 2009/0101948 A1 | 4/2009 | Park et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0295769 A1 | 12/2009 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117991 A1 | 5/2010 | Koyama et al. |
| 2010/0127279 A1 | 5/2010 | Takahashi |
| 2010/0182282 A1 | 7/2010 | Kurokawa et al. |
| 2010/0320391 A1 | 12/2010 | Antonuk |
| 2011/0095195 A1 | 4/2011 | Imai |
| 2011/0176038 A1 | 7/2011 | Kurokawa et al. |
| 2011/0215323 A1 | 9/2011 | Kurokawa et al. |
| 2011/0220889 A1 | 9/2011 | Kurokawa et al. |
| 2011/0221723 A1 | 9/2011 | Kurokawa et al. |
| 2012/0002090 A1 | 1/2012 | Aoki et al. |
| 2012/0056861 A1 | 3/2012 | Kurokawa et al. |
| 2012/0126124 A1 | 5/2012 | Nakatsugawa et al. |
| 2012/0126129 A1 | 5/2012 | Nakatsugawa et al. |
| 2012/0146027 A1 | 6/2012 | Tamura et al. |
| 2012/0193542 A1 | 8/2012 | Yamada |
| 2012/0301989 A1* | 11/2012 | Hashimoto et al. ............ 438/57 |

FOREIGN PATENT DOCUMENTS

| | | |
|---|---|---|
| GB | 2 386 043 | 4/2006 |
| GB | 2 415 587 | 4/2006 |
| GB | 2 415 588 | 4/2006 |
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 05-251705 | 9/1993 |
| JP | 08-264794 | 10/1996 |
| JP | 11-505377 | 5/1999 |
| JP | 2000-044236 | 2/2000 |
| JP | 2000-150900 | 5/2000 |
| JP | 2002-076356 | 3/2002 |

(56) References Cited

FOREIGN PATENT DOCUMENTS

| | | |
|---|---|---|
| JP | 2002-289859 | 10/2002 |
| JP | 2003-086000 | 3/2003 |
| JP | 2003-086808 | 3/2003 |
| JP | 2003-250785 | 9/2003 |
| JP | 2004-103957 | 4/2004 |
| JP | 2004-273614 | 9/2004 |
| JP | 2004-273732 | 9/2004 |
| JP | 2006-079589 | 3/2006 |
| JP | 2011-247881 | 12/2011 |
| WO | WO-2004/114391 A1 | 12/2004 |

OTHER PUBLICATIONS

Jeon.S et al., "180nm Gate Length Amorphous InGaZnO Thin Film Transistor for High Density Image Sensor Applications,", IEDM 10: Technical Digest of International Electron Devices Meeting, Dec. 6, 2010, pp. 504-507.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga2ZnO4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transistion:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

(56) References Cited

OTHER PUBLICATIONS

Osada.T et al.. "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue-Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] at Room Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett, (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

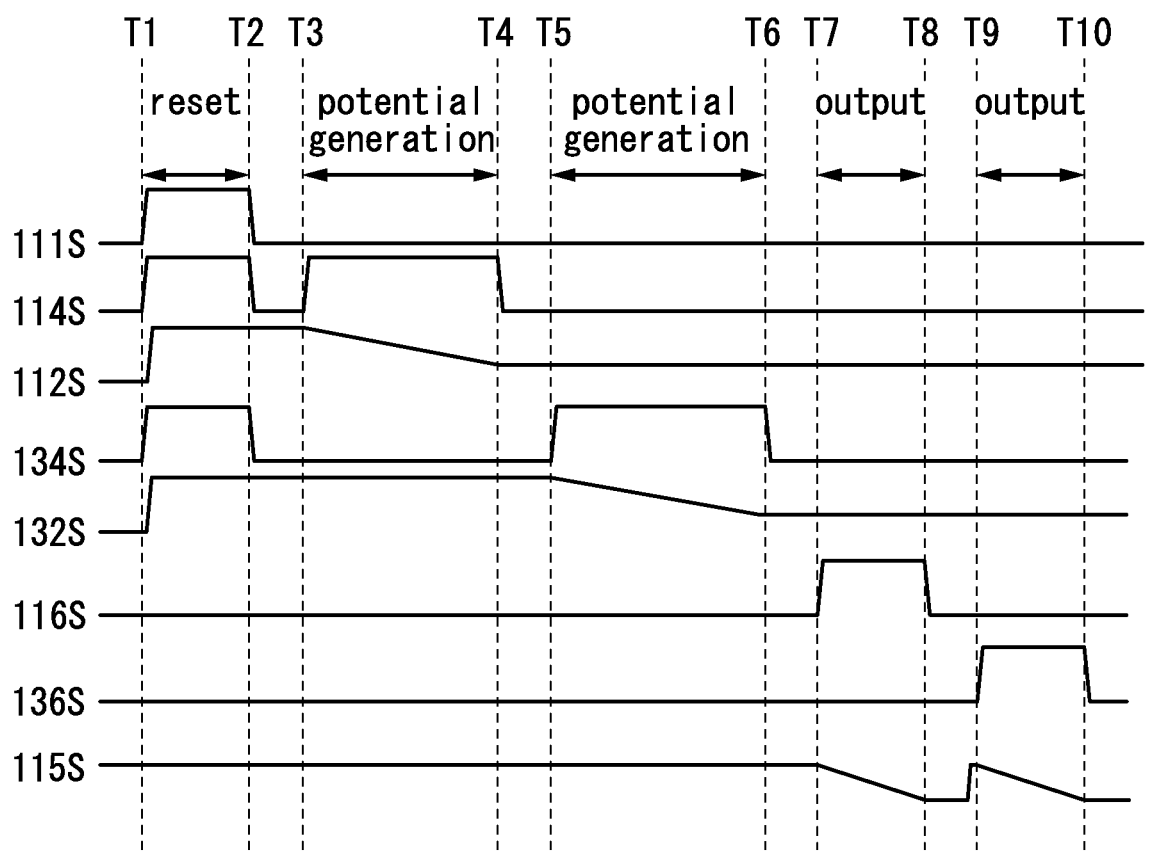

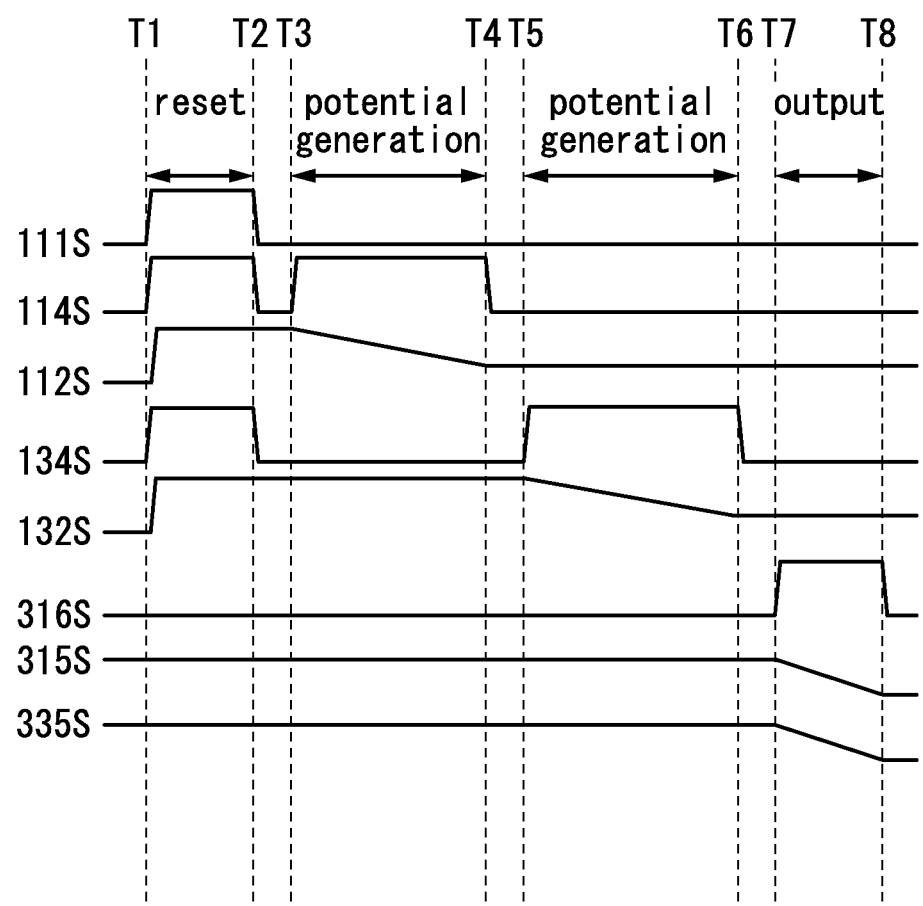

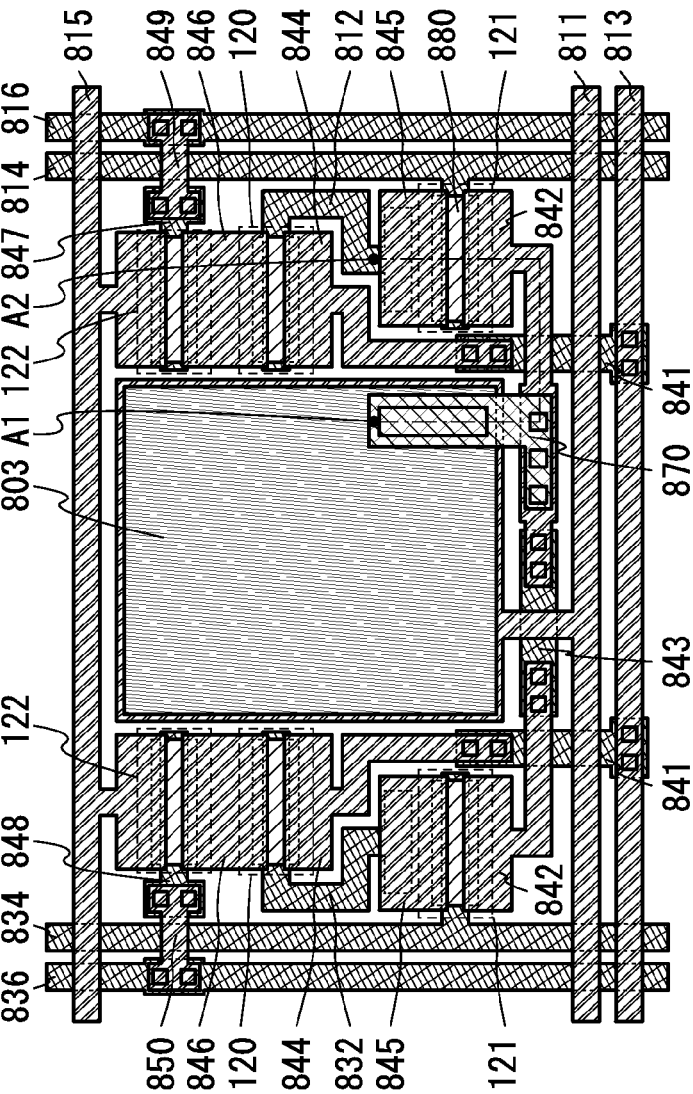
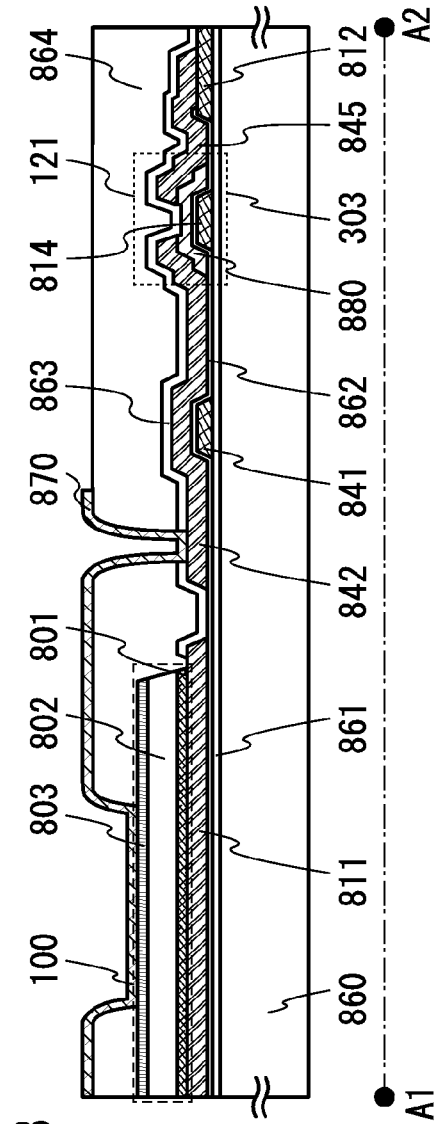
FIG. 8A
FIG. 8B

PHOTODETECTOR CIRCUIT AND SEMICONDUCTOR DEVICE

BACKGROUND OF THE INVENTION

1. Field of the Invention

The present invention relates to a photodetector circuit and a semiconductor device including the photodetector circuit.

2. Description of the Related Art

In a variety of fields, semiconductor devices including circuits (hereinafter, also referred to as "photodetector circuits") which receive light from the outside and output signals corresponding to the amount of incident light are used.

Examples of photodetector circuits are a photodetector circuit including a CMOS circuit (hereinafter, also referred to as a CMOS sensor), and a CMOS sensor includes a photoelectric conversion element (e.g., a photodiode) which enables current corresponding to the amount of incident light to flow and a signal output circuit which holds a potential based on the amount of light entering the photoelectric conversion element and outputs a signal corresponding to the potential.

Note that a CMOS sensor detects the amount of light entering a photoelectric conversion element by performing, in a signal output circuit including a MOS transistor, an operation in which a potential (also referred to as charge) held in the signal output circuit is initialized (also referred to as a reset operation), an operation in which a potential corresponding to the amount of photocurrent flowing through the photoelectric conversion element is generated (also referred to as a potential generation operation), and an operation in which a signal corresponding to the potential is output (also referred to as an output operation).

As an example of semiconductor devices including photodetector circuits, an image display device in which a photodetector circuit is provided in each of a plurality of pixels arranged in a matrix can be given (e.g., see Patent Document 1).

In the image display device, in the case where an object to be detected (e.g., a pen or a finger) exists on a display screen, part of light emitted from the image display device is reflected by the object to be detected and the amount of reflected light is detected by the photodetector circuit, whereby a region on the display screen where the object to be detected exists can be detected.

Further, as an example of semiconductor devices including photodetector circuits, a medical diagnostic imaging device provided with a scintillator and a flat panel detector including a plurality of photodetector circuits can be given (e.g., see Patent Document 2).

In the medical diagnostic imaging device, a human body is irradiated with radiation (e.g., X-rays) emitted from a radiation source, radiation which passes through the human body is converted to light (e.g., visible light) by the scintillator, and imaging data is composed by detecting the light with a photodetector circuit included in the flat panel detector, whereby an image of the inside of the human body can be obtained as electronic data.

However, in a semiconductor device which obtains a variety of data with the use of a photodetector circuit provided therein as described above, a signal (also referred to as a detection signal) output from the photodetector circuit is a composite signal including not only a signal needed for obtaining data (also referred to as an essential signal) but also an unnecessary signal (also referred to as a noise signal) in some cases.

For example, in the above image display device, a signal corresponding to "light which is reflected by the object to be detected to enter the photodetector circuit", which is output from the photodetector circuit, is an essential signal; on the other hand, a signal corresponding to "light (external light) which enters from the outside of the device, such as sunlight or fluorescent light", which is output from the photodetector circuit, is a noise signal.

Further, in the above medical diagnostic imaging device, since in light emitted by the scintillator, there occurs a phenomenon (what is called afterglow) in which light emission continues even after radiation emission stops, light received by the flat panel detector might include both "light emitted due to radiation emission" and "light emitted by afterglow".

In this case, a signal corresponding to "light emitted due to radiation emission" which is output from a photodetector circuit is an essential signal; on the other hand, a signal corresponding to "light emitted by afterglow" which is output from a photodetector circuit is a noise signal.

In order to solve the above-described problem in that a detection signal output from a photodetector circuit includes not only an essential signal but also a noise signal, it is effective to remove only a noise signal selectively from a composite signal. To achieve that, for example, as an image display device, a device including photodetector circuits (CMOS sensors) arranged in a matrix is proposed as in Non-Patent Document 1.

In an image display device in Non-Patent Document 1 (see FIG. 3 in Non-Patent Document 1), in each of photodetector circuits (referred to as photosensors in Non-Patent Document 1) arranged in a matrix, a transistor M1, a transistor M2, and a capacitor $C_{INT}$ function as a signal output circuit and an element D1 functions as a photoelectric conversion element.

In addition, after a reset operation and a potential generation operation are performed in the photodetector circuits in odd-numbered rows in a period during which an object to be detected is irradiated with light by turning on a backlight, a reset operation and a potential generation operation are performed in the photodetector circuits in even-numbered rows in a period during which the object to be detected is not irradiated with light by turning off the backlight.

Note that the time interval of blinking the backlight is short, and it can be considered that the object to be detected hardly moves between when the backlight is on and when the backlight is off.

After that, output operations are performed at the same time in the photodetector circuits in two adjacent rows, and a difference between detection signals thereof is obtained. Then, this operation is performed sequentially, so that output operations are performed in the photodetector circuits in all the rows.

A difference between detection signals thus obtained using photodetector circuits in two adjacent rows is an accurate signal including only an essential signal because a signal (noise signal) corresponding to the amount of light entering the photodetector circuit when the backlight is off is removed from a signal (composite signal) corresponding to the amount of light entering the photodetector circuit when the backlight is on.

In other words, a plurality of detection signals (at least two or more detection signals) are obtained using photodetector circuits, and an accurate detection signal is obtained using the plurality of detection signals.

REFERENCE

Patent Document

[Patent Document 1] Japanese Published Patent Application No. 2006-079589
[Patent Document 2] Japanese Published Patent Application No. 2003-250785

Non-Patent Document

[Non-Patent Document 1] K. Tanaka, et al., "A System LCD with Optical Input Function using Infra-Red Backlight Subtraction Scheme", SID 2010 Digest, pp. 680-683

SUMMARY OF THE INVENTION

However, in a structure described in Non-Patent Document 1, at least two adjacent photodetector circuits are needed in order to obtain detection signals in different periods (when the backlight is on and when the backlight is off).

Therefore, in the case where there is a difference between characteristics (e.g., light-receiving sensitivity) of photoelectric conversion elements of two photodetector circuits, a detection signal output from the two photodetector circuits include the difference between characteristics of the photoelectric conversion elements.

In view of the above problem, an object of one embodiment of the disclosed invention is to provide a photodetector circuit capable of obtaining detection signals in different periods without being affected by characteristics of a photoelectric conversion element.

In addition, an object of one embodiment of the disclosed invention is to provide a semiconductor device including the above photodetector circuit.

In order to solve the above problem, in one embodiment of the disclosed invention, a photodetector circuit has a configuration in which n signal output circuits (n is a natural number of 2 or more) are connected to one photoelectric conversion element. Further, the n signal output circuits each include the following: a transistor whose gate potential varies in accordance with the amount of light entering the photoelectric conversion element and which outputs a signal corresponding to the gate potential; a first switching element which is connected between the photoelectric conversion element and the transistor and holds the gate potential of the transistor; and a second switching element which controls the signal output from the transistor.

In the case where the above configuration of a signal output circuit is employed, the gate potential of the transistor can be held by turning off the first switching element; thus, data based on the amount of light entering the photoelectric conversion element can be held in different signal output circuits in different periods. In the n signal output circuits, data in different periods (data based on the amount of light entering the photoelectric conversion element) is held, and then, the second switching elements are turned on; thus, signals in different periods can be obtained without being affected by the characteristics of the photoelectric conversion element.

In other words, according to one embodiment of the present invention, a photodetector circuit includes a photoelectric conversion element and n signal output circuits (n is a natural number of 2 or more) connected to the photoelectric conversion element. The n signal output circuits each include a transistor whose gate potential varies in accordance with the amount of light entering the photoelectric conversion element and which outputs a signal corresponding to the gate potential; a first switching element which is connected between the photoelectric conversion element and the transistor and holds the gate potential; and a second switching element which controls output of the signal. Gate potentials held in the n signal output circuits are based on the amount of light entering the photoelectric conversion element in different periods. After the gate potentials are held in the n signal output circuits, signals corresponding to the gate potentials are output from the n signal output circuits.

When the photodetector circuit has the above-described configuration, the photodetector circuit can obtain signals in different periods without being affected by characteristics of the photoelectric conversion element.

In the above-described photodetector circuit, by providing a wiring which is connected to the second switching elements in the n signal output circuits and transmits signals for controlling the operation of the second switching elements, the number of wirings necessary for performing on/off operations of the second switching elements in the signal output circuits can be reduced. In addition, since signals can be output from the n signal output circuits at the same time, the signals can be obtained in a short period.

Further, in the case where a transistor including an oxide semiconductor material in a channel formation region is used as the first switching element in the above photodetector circuit, the first switching element has extremely low off-state current, and thus can hold the gate potential of the transistor. Thus, a signal output from the signal output circuit is an extremely accurate signal including data corresponding to the amount of light entering the photoelectric conversion element.

Note that in the case where a transistor including an oxide semiconductor material in a channel formation region is used as each of the second switching element and the transistor in addition to the first switching element, elements included in the signal output circuits can be manufactured in the same steps; thus, time and cost for manufacturing photodetector circuits can be reduced.

Further, in the case where the above-described photodetector circuit is used for a semiconductor device, with a configuration in which the photodetector circuits are arranged in a matrix and gate potentials are held in the n signal output circuits in all the photodetector circuits arranged in a matrix, and then, n signals corresponding to the gate potentials are output from the photodetector circuits, signals in different periods can be obtained from all the photodetector circuits in a short period.

Specific examples of semiconductor devices include radiation imaging devices, for example. In the case where the above-described photodetector circuit is used for a radiation imaging device, the radiation imaging device includes a radiation source, a scintillator which outputs light by receiving radiation output from the radiation source, a photodetector mechanism including the photodetector circuits arranged in a matrix and a photodetector circuit control portion which controls operations of the photodetector circuits, and a detection signal comparison portion which compares signals output from the photodetector circuit control portion. The photodetector mechanism may have a structure in which gate potentials are held in the n signal output circuits in all the photodetector circuits arranged in a matrix, the n signals corresponding to the gate potentials are output from the photodetector circuits, and then, the detection signal comparison portion compares the n signals output from the photodetector circuits.

Examples of semiconductor devices other than radiation imaging devices are image display devices, for example. In the case where the above-described photodetector circuit is used for an image display device, the image display device includes a display portion in which pixels including a display element and a photodetector circuit are arranged in a matrix, a display element control portion which controls the operations of the display elements, a photodetector circuit control portion which controls the operations of the photodetector circuits, and an image signal generation portion which generates image signals by using signals output from the photodetector circuit control portion. Gate potentials are held in the n signal output circuits in all the photodetector circuits in the pixels arranged in a matrix and then, the n signals corresponding to the gate potentials are output from the photodetector circuits, and the image signal generation portion generates image signals from the n signals output from the photodetector circuits.

Further, one embodiment of the present invention is a method for operating a photodetector circuit which includes a photoelectric conversion element and n signal output circuits (n is a natural number of 2 or more) connected to the photoelectric conversion element. The n signal output circuits each include a transistor whose gate potential varies in accordance with the amount of light entering the photoelectric conversion element and which outputs a signal corresponding to the gate potential, a first switching element which is connected between the photoelectric conversion element and the transistor and which holds the gate potential, and a second switching element which controls the signal output from the transistor. The method includes the steps of: holding potentials based on the amount of light entering the photoelectric conversion element as gate potentials by turning off the first switching elements in the n signal output circuits in different periods independently of the signal output circuits; and outputting signals corresponding to the gate potentials by turning on the second switching elements.

By driving the photodetector circuit by the above-described operation method, in the photodetector circuit, signals corresponding to the amount of light entering the photoelectric conversion element in different periods can be obtained in a short period without being affected by characteristics of the photoelectric conversion element.

Note that in the above-described method for operating the photodetector circuit, by performing operations for initializing the gate potentials in the n signal output circuits at the same time, the gate potentials in the n signal output circuits can be reset at the same time; thus, signals can be obtained in a short period.

Further, in the above-described method for operating the photodetector circuit, by performing the operations of turning on the second switching elements and the operations of turning off the second switching elements in the n signal output circuits at the same time, signals can be output from the n signal output circuits at the same time; thus, the signals can be obtained in a short period.

According to one embodiment of the present invention, a photodetector circuit has a configuration in which n output circuits (n is a natural number of 2 or more) are connected to a photoelectric conversion element, and the output circuit includes a transistor whose output signal varies in accordance with the level of a potential generated, a first switching element which prevents leakage of the potential from the output circuit, and a second switching element which controls the output signal from the transistor. In the n output circuits, after the signals are held in different periods (at different timings) in the output circuits, the signals are output from the n output circuits.

Thus, a photodetector circuit capable of obtaining signals in different periods without being affected by characteristics of a photoelectric conversion element can be provided.

BRIEF DESCRIPTION OF THE DRAWINGS

In the accompanying drawings:

FIG. 2 is an operation flow chart of a photodetector circuit;

FIG. 4 is an operation flow chart of a photodetector circuit;

FIGS. 8A and 8B illustrate a layout of a photodetector circuit;

DETAILED DESCRIPTION OF THE INVENTION

Figure 1A:
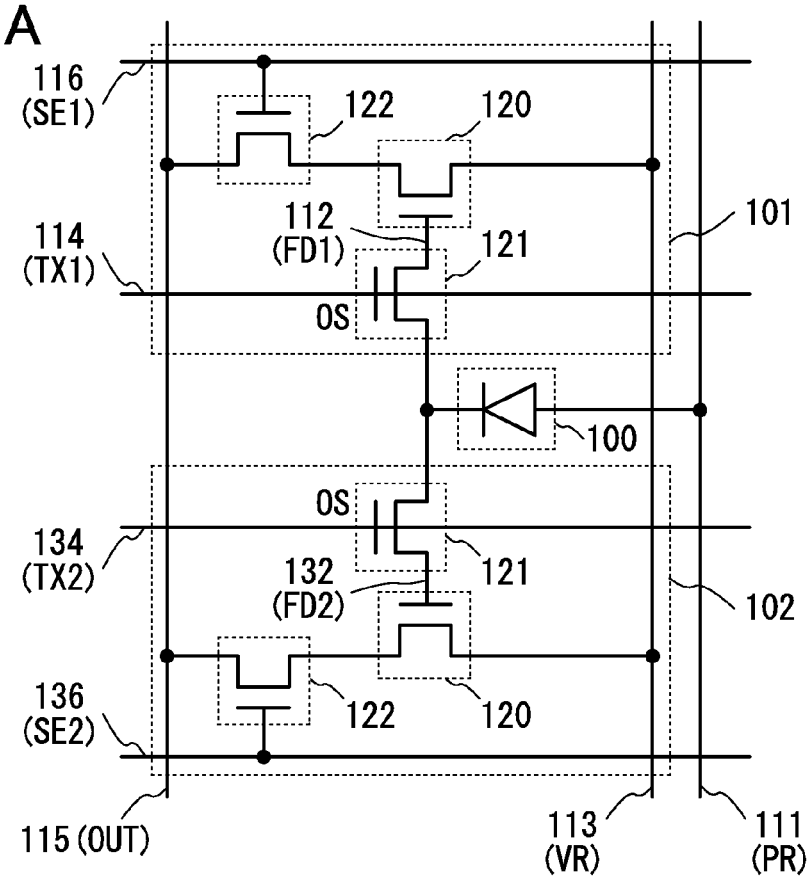
FIG. 1A illustrate a configuration of a photodetector circuit and FIG. 1B is an operation flow chart of the photodetector circuit.

Embodiments will be described below in detail with reference to the accompanying drawings. Note that embodiments described below can be implemented in many different modes, and it is easily understood by those skilled in the art that modes and details can be variously changed without departing from the spirit and scope of the present invention. Therefore, the present invention should not be construed as being limited to the following description of the embodiments. In the drawings for explaining the embodiments, the same parts or parts having a similar function are denoted by the same reference numerals, and description of such parts is not repeated.

Note that in the embodiments described below, "one terminal" of a transistor refers to one of a source electrode and a drain electrode, and "the other terminal" of the transistor refers to the other of the source electrode and the drain electrode. That is, when one terminal of the transistor is the source electrode, the other terminal of the transistor refers to the drain electrode.

Note that "electrical connection" in this specification corresponds to the state where current, voltage, or potential can be supplied or transmitted. Therefore, a state of electrical connection means not only a state of direct connection but also a state of indirect connection through a circuit element such as a wiring, a resistor, a diode, or a transistor, in which current, voltage, or potential can be supplied or transmitted.

Unless otherwise specified, in the case of an n-channel transistor, the off-state current in this specification is a current that flows between a source electrode and a drain electrode when the potential of a gate electrode is less than or equal to 0 V with the potential of the source electrode as a reference potential while the potential of the drain electrode is higher than those of the source electrode and the gate electrode. Moreover, in the case of a p-channel transistor, the off-state current in this specification is a current that flows between a source electrode and a drain electrode when the potential of a gate electrode is greater than or equal to 0 V with the potential of the source electrode as a reference potential while the potential of the drain electrode is lower than those of the source electrode and the gate electrode.

Embodiment 1

In this embodiment, a configuration and an operation method of a photodetector circuit are described with reference to FIGS. 1A and 1B and FIG. 2.

<Configuration of Photodetector Circuit>

FIG. 1A shows an example of a circuit diagram illustrating a configuration of a photodetector circuit. The photodetector circuit includes a photoelectric conversion element 100 and two signal output circuits (a first signal output circuit 101 and a second signal output circuit 102) connected to the photoelectric conversion element 100.

<Photoelectric Conversion Element>

Figure 1B:
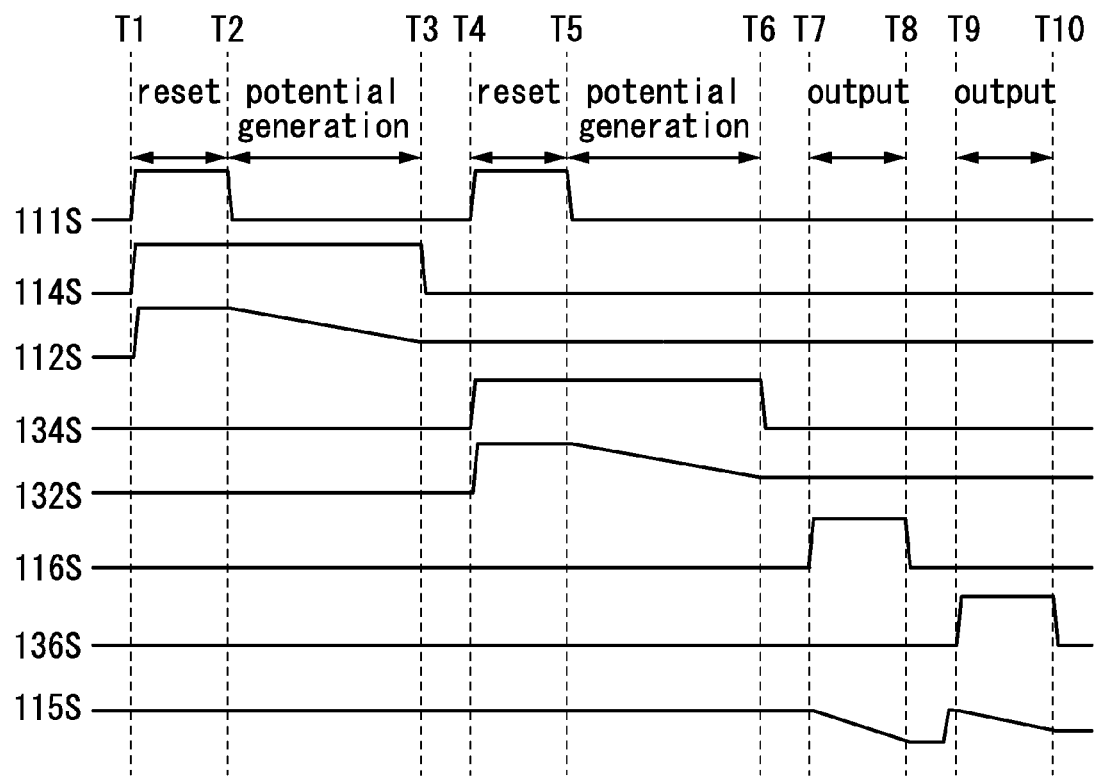

As the photoelectric conversion element 100, a photodiode is illustrated in FIGS. 1A and 1B. The photodiode generates current by irradiation with light from the outside, and the value of photocurrent varies in accordance with the intensity of incident light. Note that the photoelectric conversion element 100 is not limited to a photodiode. For example, the photoelectric conversion element 100 may be a variable resistor. The variable resistor can include a pair of electrodes and an amorphous silicon layer having i-type conductivity provided between the pair of electrodes. The i-type amorphous silicon layer can be used in a manner similar to that of a photodiode because the resistance of the i-type amorphous silicon layer varies by irradiation with light.

One of the electrodes of the photoelectric conversion element 100 is connected to a wiring 111 (also referred to as a wiring PR) and the other of the electrodes of the photoelectric conversion element 100 is connected to the first signal output circuit 101 and the second signal output circuit 102.

Needless to say, one of the electrodes of the photoelectric conversion element 100 may be connected to the first signal output circuit 101 and the second signal output circuit 102 and the other of the electrodes of the photoelectric conversion element 100 may be connected to the wiring 111.

The signal output circuits (the first signal output circuit 101 and the second signal output circuit 102) hold potentials including the amount of light entering the photoelectric conversion element 100 as data in the circuits and output detection signals corresponding to the potentials to the outside.

In the description of this embodiment, the two signal output circuits (the first signal output circuit 101 and the second signal output circuit 102) have the same structure; thus, components included in the signal output circuits are denoted by the same reference numerals. For example, both a transistor in the first signal output circuit 101 and a transistor in the second signal output circuit 102 are referred to as a "transistor 120".

<Detection Circuit>

The first signal output circuit 101 includes the following: a transistor 120 whose gate potential varies in accordance with the amount of light entering the photoelectric conversion element 100 and which outputs a signal corresponding to the gate potential; a first switching element 121 which is connected between the photoelectric conversion element 100 and the transistor 120, controls the connection state therebetween, and holds a potential applied to a gate of the transistor 120; and a second switching element 122 which controls the signal output from the transistor 120.

The gate of the transistor 120 in the first signal output circuit 101 is connected to a wiring 112 (also referred to as a wiring FD1), one of a source and a drain of the transistor 120 in the first signal output circuit 101 is connected to a wiring 113 (also referred to as a wiring VR), and the other of the source and the drain of the transistor 120 in the first signal output circuit 101 is connected to one of electrodes of the second switching element 122.

Since the first switching element 121 in the first signal output circuit 101 holds the potential applied to the gate of the transistor 120, it is preferable that the first switching element 121 have extremely low leakage current in an off state.

As an example of a switching element which has low leakage current in an off state, a transistor which includes an oxide semiconductor material in a channel formation region can be given.

The above oxide semiconductor material preferably contains at least indium (In) or zinc (Zn). In particular, In and Zn are preferably contained. The oxide semiconductor material preferably contains, in addition to In and Zn, gallium (Ga) serving as a stabilizer that reduces variations in electrical characteristics among transistors including the oxide semiconductor material. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

The bandgap of a film using an oxide semiconductor material is greater than or equal to 3.0 eV (electron volts), which is much wider than the bandgap of silicon (1.1 eV).

The off-resistance of a transistor (resistance between a source and a drain of the transistor in an off state) is inversely proportional to the concentration of carriers thermally excited in a channel formation region. Since the bandgap of silicon is 1.1 eV even in a state where there is no carrier caused by a donor or an acceptor (i.e., even in the case of an intrinsic semiconductor), the concentration of thermally excited carriers at room temperature (300 K) is approximately $1 \times 10^{11}$ cm$^{-3}$.

The bandgap of a film using an oxide semiconductor material is generally as wide as 3.0 eV or more as described above, and the concentration of thermally excited carriers in a film with a bandgap of 3.2 eV, for example, is approximately $1 \times 10^{-7}$ cm$^{-3}$. When the electron mobility is the same, the resistivity is inversely proportional to the carrier concentration, and thus the resistivity of the semiconductor with a bandgap of 3.2 eV is 18 orders of magnitude higher than that of silicon.

Since a transistor that uses such a wide bandgap oxide semiconductor material in a channel formation region can achieve extremely low off-state current.

Further, the transistor is used as the first switching element 121, and after the gate potential of the transistor 120 varies in accordance with the amount of light entering the photoelectric conversion element 100, the first switching element 121 is turned off, whereby the gate potential of the transistor 120 can be held in the wiring 112 for a long time.

Although a transistor including an oxide semiconductor material in a channel formation region is described above as an example of the first switching element 121, another switching element having low off-state current may be used. For example, a transistor using a magnetoresistance effect (also referred to as a spin transistor or the like), a transistor using a ferroelectric material for a gate insulating film (also referred to as a ferroelectric transistor or the like), or the like can be used.

A signal corresponding to the gate potential of the transistor 120 is output from the drain (or source) of the transistor 120. Accordingly, the signal can be regarded as a "signal including the amount of light entering the photoelectric conversion element 100 as data".

One of a source and a drain of the transistor including an oxide semiconductor material in a channel formation region, which is used as the first switching element 121, is connected to the other of the electrodes of the photoelectric conversion element 100, the other of the source and the drain of the transistor including an oxide semiconductor material in a channel formation region is connected to the gate of the transistor 120, and a gate of the transistor including an oxide semiconductor material in a channel formation region is connected to a wiring 114 (also referred to as a wiring TX1).

Although in this embodiment and the like, a transistor including an oxide semiconductor material in a channel formation region is used as the first switching element 121, the first switching element 121 is not limited to a transistor as long as it is an element capable of switching on and off of a connection state (conduction state), and a variety of known techniques can be used.

One of a source and a drain of the second switching element 122 in the first signal output circuit 101 is connected to the other of the source and the drain of the transistor 120, the other of the source and the drain of the second switching element 122 in the first signal output circuit 101 is connected to a wiring 115 (also referred to as a wiring OUT), and a gate of the second switching element 122 in the first signal output circuit 101 is connected to a wiring 116 (also referred to as a wiring SE1).

In the case where a transistor is used as the second switching element 122 as illustrated in FIG. 1A, by setting Vgs (a voltage difference between a gate and a source when the source is used as a reference) of the transistor to a voltage sufficiently higher than the threshold voltage, a signal output from the transistor 120 is output to the wiring 115 (OUT).

Note that an integrator circuit may be connected to the wiring 115 (OUT). Connecting the integrator circuit to the wiring 115 (OUT) increases S/N, enabling detection of weaker light. A specific configuration example of the integrator circuit will be described in Embodiment 2.

The second signal output circuit 102 includes the following: the transistor 120 whose gate potential varies in accordance with the amount of light entering the photoelectric conversion element 100 and which outputs a signal corresponding to the gate potential; the first switching element 121 which is connected between the photoelectric conversion element 100 and the transistor 120, controls the connection state therebetween, and holds a potential applied to a gate of the transistor 120; and the second switching element 122 which controls the signal output from the transistor 120.

The gate of the transistor 120 in the second signal output circuit 102 is connected to a wiring 132 (also referred to as a wiring FD2), one of a source and a drain of the transistor 120 in the second signal output circuit 102 is connected to the wiring 113 (also referred to as the wiring VR), and the other of the source and the drain of the transistor 120 in the second signal output circuit 102 is connected to one of electrodes of the second switching element 122.

The wiring connected to the one of the source and the drain of the transistor 120 in the second signal output circuit 102 is the same as the wiring 113 in the first signal output circuit 101.

Since the first switching element 121 in the second signal output circuit 102 holds the potential applied to the gate of the transistor 120, the first switching element 121 preferably has extremely low off-state current, and for example, a transistor including an oxide semiconductor material in a channel formation region can be used. For the description of the transistor including an oxide semiconductor material in a channel formation region, the above "description of the first signal output circuit 101" can be referred to.

Since the transistor including an oxide semiconductor material in a channel formation region has extremely low off-state current, the transistor is used as the first switching element 121, and after the gate potential of the transistor 120 varies in accordance with the amount of light entering the photoelectric conversion element 100, the first switching element 121 is turned off, whereby the gate potential of the transistor 120 can be held in the wiring 132 for a long time.

Further, a signal (hereinafter, the signal output from the second signal output circuit 102 is also referred to as a second signal) corresponding to the gate potential of the transistor 120 is output from the drain (or source) of the transistor 120.

One of a source and a drain of the transistor including an oxide semiconductor material in a channel formation region, which is used as the first switching element 121, is connected to the other of the electrodes of the photoelectric conversion element 100, the other of the source and the drain of the transistor including an oxide semiconductor material in a channel formation region is connected to the gate of the transistor 120, and a gate of the transistor including an oxide semiconductor material in a channel formation region is connected to a wiring 134 (also referred to as a wiring TX2).

Although in this embodiment and the like, a transistor including an oxide semiconductor material in a channel formation region is used as the first switching element 121, the first switching element 121 is not limited to a transistor as long as it is an element capable of switching on and off of a connection state (conduction state).

One of a source and a drain of the second switching element 122 in the second signal output circuit 102 is connected to the other of the source and the drain of the transistor 120, the other of the source and the drain of the second switching element 122 in the second signal output circuit 102 is connected to the wiring 115 (also referred to as the wiring OUT), and the gate of the second switching element 122 in the second signal output circuit 102 is connected to a wiring 136 (also referred to as a wiring SE2).

The wiring connected to the other of the source and the drain of the second switching element 122 in the second signal output circuit 102 is the same as the wiring 115 in the first signal output circuit 101.

When the photodetector circuit has the above-described structure, by turning on the first switching elements 121 in the signal output circuits at different timings, the amount of light entering the photoelectric conversion element 100 at different timings can be detected. By turning off the first switching elements 121, the data can be held as gate potentials; thus, for example, even when light entering the photoelectric conversion element 100 in a first period is light generating a composite signal, a potential including the light as data is held in the first signal output circuit 101, light generating a noise signal is detected in a second period, and a potential including the light as data is held in the second signal output circuit 102, whereby a signal necessary for generation of an essential signal can be obtained from the photodetector circuit.

In this embodiment, it is preferable that the transistor 120 have high mobility because the transistor 120 amplifies an electrical signal generated by the photoelectric conversion element 100.

As an example of the transistor 120 having high mobility, a thin film transistor including amorphous silicon, microcrystalline silicon, polycrystalline silicon, single crystal silicon, or the like in a channel formation region can be given.

Further, the transistor 120 needs low off-state current characteristics in order to prevent output of an unnecessary potential to the wiring 113 (VR). For these reasons, it is also effective to use a transistor using an oxide semiconductor material, which achieves both high mobility and low off-state current in a channel formation region, as the transistor 120.

In this embodiment, the second switching element 122 preferably has high mobility because of controlling output of a signal from the signal output circuit.

As an example of the second switching element 122 having high mobility, a thin film transistor including amorphous silicon, microcrystalline silicon, polycrystalline silicon, single crystal silicon, or the like in a channel formation region can be given.

Further, the second switching element 122 needs low off-state current characteristics in order to prevent output of an unnecessary potential to the wiring 115 (OUT). For these reasons, it is also effective to use a transistor using an oxide semiconductor material, which achieves both high mobility and low off-state current in a channel formation region, as the second switching element 122.

The use of transistors including an oxide semiconductor material in a channel formation region as all the components (the transistor 120, the first switching element 121, and the second switching element 122) in each of the signal output circuits can simplify the manufacturing process of the signal output circuits.

When a semiconductor material capable of providing higher mobility than an oxide semiconductor material, such as polycrystalline or single crystal silicon, is used for the channel formation regions of the transistor 120 and the second switching element 122, data can be read from the signal output circuit at high speed.

Connecting a capacitor to the wiring 115 (OUT) is effective in stabilizing the potential of the wiring 115 (OUT).

In FIG. 1A, the transistor 120 and the second switching element 122 are connected in series in this order between the wiring 113 (VR) and the wiring 115 (OUT); alternatively, the transistor 120 and the second switching element 122 may be connected in reverse.

In FIG. 1A, the transistor 120 has a gate only on one side of a semiconductor layer; however, the transistor 120 may have a pair of gates placed so that the semiconductor layer is sandwiched therebetween. When the transistor 120 has a pair of gates placed so that the semiconductor layer is sandwiched therebetween, one of the gates can function as a front gate to which the potential of the wiring 112 (or the wiring 132) is applied, and the other gate can function as a backgate that controls the threshold voltage or the like of the transistor 120. In this case, the potential applied to the other gate preferably ranges from −20 V to +2 V with reference to the source potential. If a change in the threshold voltage of the transistor 120 does not adversely affect the operation of the signal output circuit when the potential applied to the other gate varies in the above range, the other gate may be electrically isolated (floating).

The above is the description of the configuration of the circuits in the photodetector circuit. A layout example of the configuration of the circuits illustrated in FIG. 1A, which is described in this embodiment, will be described in Embodiment 4.

Figure 15:
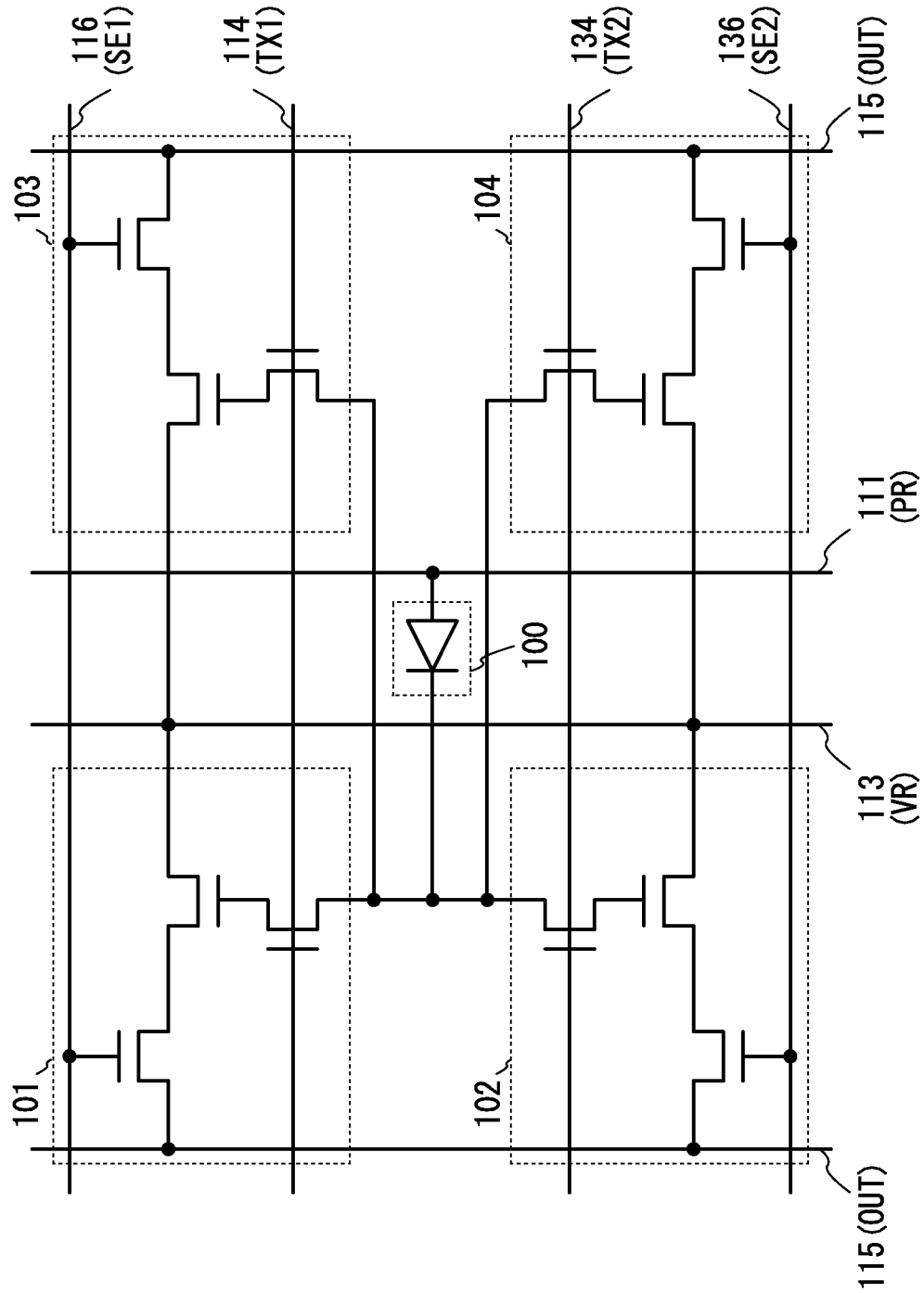
FIG. 15 illustrates a configuration of a photodetector circuit.

Although the photodetector circuit described in this embodiment includes one photoelectric conversion element and two signal output circuits connected to the photoelectric conversion element, it may include n signal output circuits (n is a natural number of 2 or more). For example, as illustrated in FIG. 15, a structure in which one photoelectric conversion element and four signal output circuits (the first signal output circuit 101, the second signal output circuit 102, a third signal output circuit 103, and a fourth signal output circuit 104) are provided may be used. Since one photoelectric conversion element is shared by four signal output circuits, sharing wirings and a large-area photoelectric conversion element can be achieved. Alternatively, in the case where the area of the photoelectric conversion element does not need to be increased, the area of the photodetector circuit can be reduced.

Figure 5:
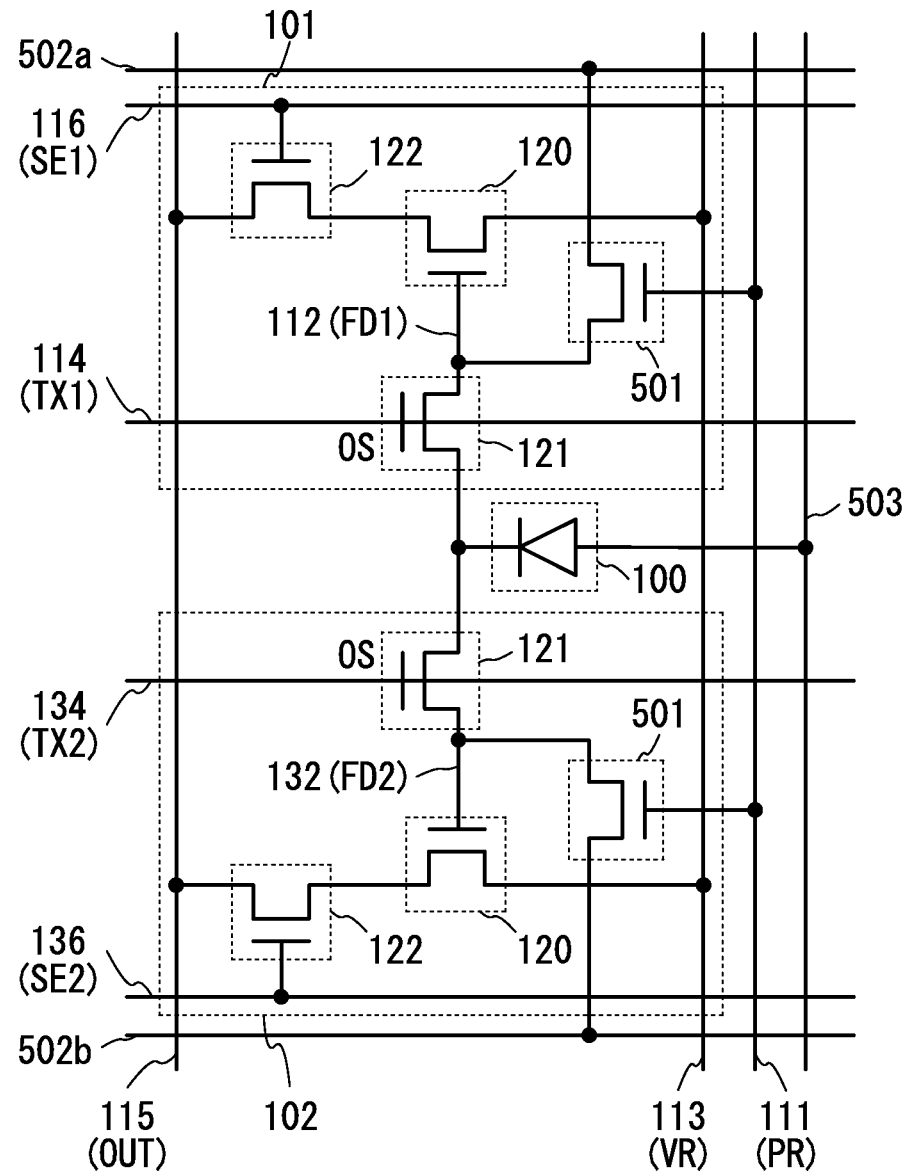
FIG. 5 illustrates a configuration of a photodetector circuit.

Further, the configuration of the photodetector circuit described in this embodiment may be a configuration in which a transistor 501 is added to each of the first signal output circuit 101 and the second signal output circuit 102 as illustrated in FIG. 5. A gate of the transistor is electrically connected to the wiring 111 (PR), one of a source and a drain of the transistor is electrically connected to the wiring 112 (FD1) (or the wiring 132 (FD2)), and the other of the source and the drain of the transistor is electrically connected to a wiring 502a (or a wiring 502b). The one of the electrodes of the photoelectric conversion element 100 is electrically connected to a wiring 503. Here, the wiring 503 is a signal line (low potential line) for applying a reverse bias to the photoelectric conversion element 100. Further, the wiring 502a and the wiring 502b are signal lines (high potential lines) for resetting the wiring 112 (FD1) (or the wiring 132 (FD2)) to a high potential.

The transistor 501 functions as a reset transistor for resetting the wiring 112 (FD1) (or the wiring 132 (FD2)). Accordingly, unlike in the detection circuit in FIG. 1A, the reset operation using the photoelectric conversion element 100 is not performed, and a reverse bias is always applied to the photoelectric conversion element 100. The wiring 112 (FD1) and the wiring 132 (FD2) can be reset by setting the potential of the wiring 111 (PR) high.

The transistor 501 can be formed using a silicon semiconductor such as amorphous silicon, microcrystalline silicon, polycrystalline silicon, or single crystal silicon; however, when leakage current is large, the charge accumulation portion cannot hold charge long enough. For this reason, like the transistor 120, it is preferable to use a transistor including a semiconductor layer (at least a channel formation region) formed using an oxide semiconductor material, which achieves extremely low off-state current.

<Operation Flow Chart of Photodetector Circuit>

Next, an operation flow chart of the photodetector circuit illustrated in FIG. 1A will be described with reference to FIG. 1B.

In FIGS. 1B, 114S, 112S, and 116S correspond to potentials of the wiring 114 (TX1), the wiring 112 (FD1), and the wiring 116 (SE1) in the first signal output circuit 101, and 134S, 132S, and 136S correspond to potentials of the wiring 134 (TX2), the wiring 132 (FD2), and the wiring 136 (SE2) in the second signal output circuit 102. Further, 111S and 115S correspond to potentials of the wiring 111 (PR) and the wiring 115 (OUT) which are used in common in the first signal output circuit 101 and the second signal output circuit 102. Note that the potential of the wiring 113 (VR) is fixed at a low level.

First, at a time T1, the potential (the signal 111S) of the wiring 111 is set high and the potential (the signal 114S) of the wiring 114 (TX1) in the first signal output circuit 101 is set high (i.e., a reset operation starts).

Thus, a forward bias is applied to the photoelectric conversion element 100 and the potential (the signal 112S) of the wiring 112 (FD1) in the first signal output circuit 101 becomes high. Note that the potential (the signal 115S) of the wiring 115 (OUT) is precharged to high.

Next, at a time T2, the potential (the signal 111S) of the wiring 111 (PR) is set low and the potential (the signal 114S) of the wiring 114 (TX1) in the first signal output circuit 101 is set high (i.e., the reset operation finishes and a potential generation operation starts).

Thus, reverse current flows through the photoelectric conversion element 100 in accordance with the amount of light entering the photoelectric conversion element 100, and the potential (the signal 112S) of the wiring 112 (FD1) in the first signal output circuit 101 starts to be lowered.

Since the amount of reverse current increases when the photoelectric conversion element 100 is irradiated with light, the speed of decrease in the potential (the signal 112S) of the wiring 112 (FD) in the first signal output circuit 101 changes in accordance with the amount of incident light. In other words, the channel resistance between the source and the drain of the transistor 120 in the first signal output circuit 101 changes in accordance with the amount of light entering the photoelectric conversion element 100.

Then, at a time T3, the potential (the signal 114S) of the wiring 114 (TX1) in the first signal output circuit 101 is set low (i.e., the potential generation operation finishes).

Since the first switching element 121 in this embodiment and the like is a transistor which includes an oxide semiconductor material in a channel formation region as described above and thus has extremely low off-state current, the potential applied to the gate of the transistor 120 in the first signal output circuit 101 can be held in the wiring 112 (FD 1) until an output operation is performed later.

Note that when the potential (the signal 114S) of the wiring 114 (TX1) in the first signal output circuit 101 is set low, the potential of the wiring 112 (FD) sometimes changes because of parasitic capacitance between the wiring 114 (TX1) and the wiring 112 (FD1) in the first signal output circuit 101. A large amount of potential change makes it impossible to obtain an accurate amount of charge generated by the photoelectric conversion element 100 during the potential generation operation.

Examples of effective measures to reduce the amount of potential change include reducing the capacitance between the gate and the source (or between the gate and the drain) of the transistor used as the first switching element 121, increasing the gate capacitance of the transistor 120, and providing a storage capacitor to connect the wiring 112 (FD1) in the first signal output circuit 101. Note that in FIG. 1B, the potential change can be ignored by the adoption of these measures.

Next, also in the second signal output circuit 102, in order to hold a potential including the amount of light entering the photoelectric conversion element 100 as data in the second signal output circuit 102, a "reset operation" and a "potential generation operation" are performed in a manner similar to those of the above operations in the first signal output circuit 101. Thus, the potential including the amount of light entering the photoelectric conversion element 100 as data can be held in the wiring 132 until an output operation is performed later (the operations from the time T4 to the time T6 correspond to the reset operation and the potential generation operation).

Then, at a time T7, when the potential (the signal 116S) of the wiring 116 (SE1) in the first signal output circuit 101 is set high (i.e., the output operation starts), current corresponding to the gate potential of the transistor 120 flows between the source and the drain of the second switching element 122, so that the potential (the signal 115S) of the wiring 115 (OUT) decreases. Note that precharge of the wiring 115 (OUT) is terminated before the time T7.

Here, the speed of decrease in the potential (the signal 115S) of the wiring 115 (OUT) depends on the channel resistance between the source and the drain of the transistor 120 in the first signal output circuit 101. That is, the speed of decrease in the potential (the signal 115S) of the wiring 115 (OUT) changes in accordance with the amount of light entering the photoelectric conversion element 100 during the potential generation operation in the first signal output circuit 101.

Then, at a time T8, when the potential (the signal 116S) of the wiring 116 (SE1) in the first signal output circuit 101 is set low (i.e., the output operation finishes), current flowing between the source and the drain of the second switching element 122 is stopped and the potential (the signal 115S) of the wiring 115 (OUT) becomes a fixed value.

Here, the fixed value varies in accordance with the amount of light entering the photoelectric conversion element 100 during the potential generation operation in the first signal output circuit 101. Thus, by obtaining the potential (the signal 115S) of the wiring 115 (OUT), the amount of light entering the photoelectric conversion element 100 during the potential generation operation in the first signal output circuit 101 can be found out. That is, a signal output from the first signal output circuit 101 after the output operation is a detection signal in the first signal output circuit 101.

More specifically, in the case where the amount of light entering the photoelectric conversion element 100 is large, in the first signal output circuit 101, the potential (the signal 112S) of the wiring 112 (FD1) becomes lower and the gate potential of the transistor 120 becomes lower; thus, the speed of decrease in the potential (the signal 115S) of the wiring 115 (OUT) becomes lower. As a result, the potential of the wiring 115 (OUT) becomes higher.

Alternatively, in the case where the amount of light entering the photoelectric conversion element 100 is small, in the first signal output circuit 101, the potential (the signal 112S) of the wiring 112 (FD1) becomes higher and the gate potential of the transistor 120 becomes higher; thus, the speed of decrease in the potential (the signal 115S) of the wiring 115 (OUT) becomes higher. As a result, the potential of the wiring 115 (OUT) becomes lower.

Next, the wiring 115 (OUT) is precharged.

Also in the second signal output circuit 102, an "output operation" is performed in a manner similar to that of the above operation in the first signal output circuit 101. Thus, a detection signal in the second signal output circuit 102 is obtained (the operations between the time T9 and the time T10 correspond to the output operation).

As described above, potentials (data) based on the amount of light entering the photoelectric conversion element 100 in different periods (a potential generation operation period in the first signal output circuit 101 and a potential generation operation period in the second signal output circuit 102) can be held in the signal output circuits by using the transistor 120 and the first switching element 121. Further, after the potentials are held in all the signal output circuits, a detection signal is obtained from each of the signal output circuits by using the second switching element in the signal output circuit; thus, detection signals in different periods can be obtained without being affected by characteristics of the photoelectric conversion element.

The above is the description of the operation flow chart of the photodetector circuit of this embodiment.

<Different Operation Flow Chart of Photodetector Circuit>

Note that the operation flow chart of the photodetector circuit described in FIG. 1A may be an operation flow chart different from the above operation flow chart described using FIG. 1B. The operation flow chart different from the above-described operation flow chart is described below using FIG. 2.

First, at a time T1, the potential (the signal 111S) of the wiring 111 is set high and the potential (the signal 114S) of the wiring 114 (TX1) in the first signal output circuit 101 and the potential (the signal 134S) of the wiring 134 (TX2) in the second signal output circuit 102 are set high (i.e., a reset operation starts).

In the operation flow chart described in FIG. 1B, reset operations are performed in the first signal output circuit 101 and the second signal output circuit 102 in separate steps. By performing reset operations in the first signal output circuit 101 and the second signal output circuit 102 at the same time as illustrated in FIG. 2, a period from the reset operation start to the output operation end (period from the time T1 to the time T10) can be shortened, so that detection signals in different periods can be obtained in a short period.

Note that since the following operation flow chart is the same as that in the above operation flow chart described using FIG. 1B except for the operation flow chart between the time T4 and the time T5, the operation flow chart described using FIG. 1B can be referred to for the following operation flow chart.

The above is the description of the different operation flow chart of the photodetector circuit.

In the case of using the above-described operation, it is preferable that capacitance in the wiring 112 (FD1) and the wiring 132 (FD2) be larger than wiring capacitances between the photoelectric conversion element 100 and the first switching element 121 in the first signal output circuit 101 and between the photoelectric conversion element 100 and the first switching element 121 in the second signal output circuit 102.

Embodiment 2

In this embodiment, a photodetector circuit whose structure and operation method are different from those in Embodiment 1 will be described with reference to FIGS. 3A and 3B and FIG. 4.

<Configuration of Photodetector Circuit>

Figure 3A:
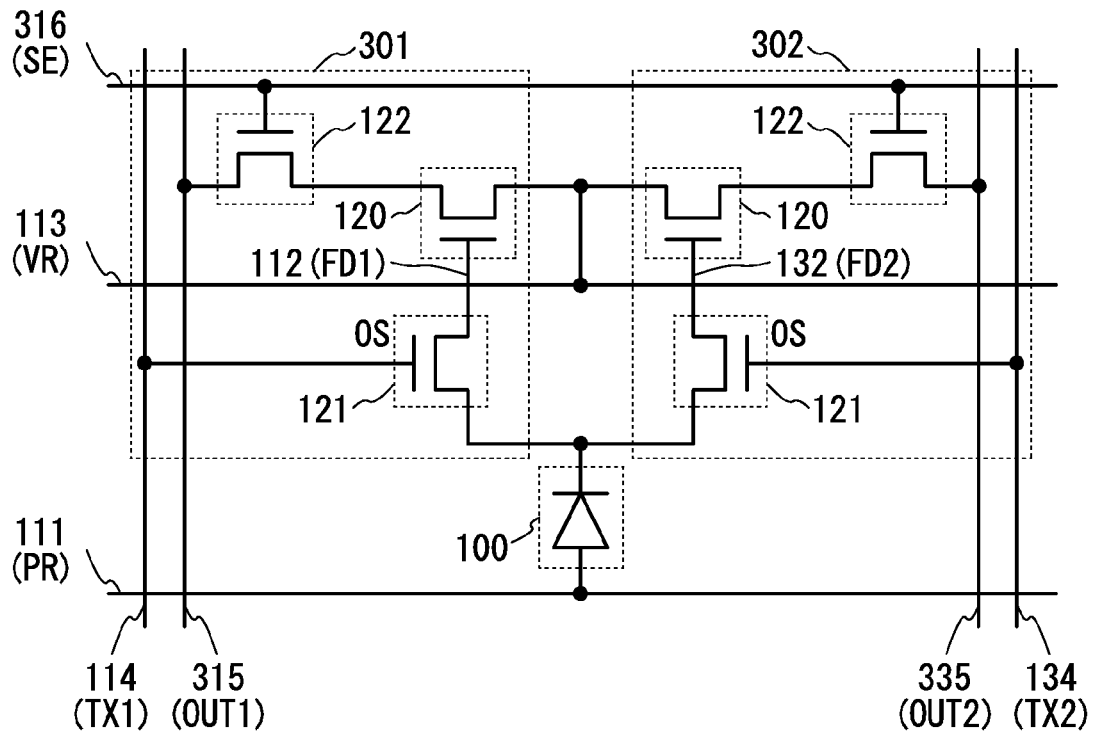
FIG. 3A illustrates a configuration of a photodetector circuit and FIG. 3B is an operation flow chart of the photodetector circuit.

FIG. 3A shows an example of a circuit diagram illustrating a configuration of a photodetector circuit. The photodetector circuit includes, as in Embodiment 1, the photoelectric conversion element 100 and two signal output circuits (a first signal output circuit 301 and a second signal output circuit 302) connected to the photoelectric conversion element 100.

<Photoelectric Conversion Element>

Although a photodiode is used as the photoelectric conversion element 100 as in Embodiment 1, the photoelectric conversion element 100 is not limited to a photodiode.

One of the electrodes of the photoelectric conversion element 100 is connected to the wiring 111 (PR) and the other of the electrodes of the photoelectric conversion element 100 is connected to the first signal output circuit 301 and the second signal output circuit 302.

The signal output circuits (the first signal output circuit 301 and the second signal output circuit 302) hold potentials including the amount of light entering the photoelectric conversion element 100 as data in the circuits and output detection signals corresponding to the potentials (data) to the outside.

<Detection Circuit>

Although this embodiment is similar to Embodiment 1 in that the first signal output circuit 301 and the second signal output circuit 302 illustrated in FIG. 3A each include the transistor 120, the first switching element 121, and the second switching element 122 as components, different points are as follows: a wiring which controls the operation state of the second switching element 122 is shared by the first signal output circuit 301 and the second signal output circuit 302; and different wirings are used in the first signal output circuit 301 and the second signal output circuit 302 to output a detection signal.

Specifically, in the photodetector circuit illustrated in FIG. 1A, the second switching element 122 in the first signal output circuit 101 is connected to the wiring 116 (SE1), and the second switching element 122 in the second signal output circuit 102 is connected to the wiring 136 (SE2).

In contrast, in the photodetector circuit illustrated in FIG. 3A, the second switching element 122 in the first signal output circuit 301 and the second switching element 122 in the second signal output circuit 302 are both connected to a wiring 316 (SE).

Further, in the photodetector circuit illustrated in FIG. 1A, the second switching element 122 in the first signal output circuit 101 and the second switching element 122 in the second signal output circuit 102 are both connected to the wiring 115 (OUT).

In contrast, in the photodetector circuit illustrated in FIG. 3A, the second switching element 122 in the first signal output circuit 301 is connected to a wiring 315 (OUT1) and the second switching element 122 in the second signal output circuit 302 is connected to a wiring 335 (OUT2).

When the photodetector circuit has the above-described structure, detection signals can be output from the first signal output circuit 301 and the second signal output circuit 302 at the same time; thus, detection signals can be obtained in a short period.

Figure 6:
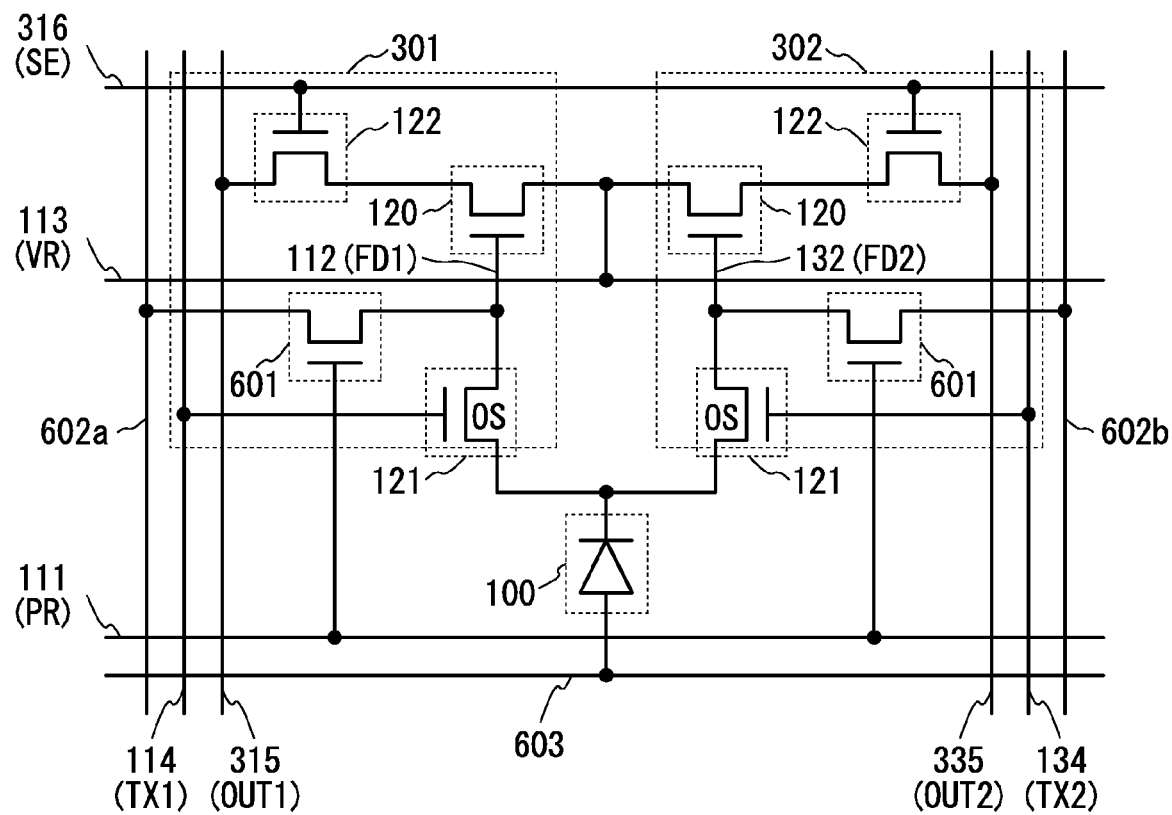
FIG. 6 illustrates a configuration of a photodetector circuit.

Note that the configuration of the photodetector circuit described in this embodiment may be a configuration in which a transistor 601 is added to each of the first signal output circuit 301 and the second signal output circuit 302 as illustrated in FIG. 6. A gate of the transistor is electrically connected to the wiring 111 (PR), one of a source and a drain of the transistor is electrically connected to the wiring 112 (FD1) (or the wiring 132 (FD2)), the other of the source and the drain of the transistor is electrically connected to a wiring 602a (or a wiring 602b), and the one of the electrodes of the photoelectric conversion element 100 is electrically connected to a wiring 603. Here, the wiring 603 is a signal line (low potential line) for always applying a reverse bias to the photoelectric conversion element 100. Further, the wiring 602a and the wiring 602b are signal lines (high potential lines) for resetting the wiring 112 (FD1) (or the wiring 132 (FD2)) to a high potential.

The transistor 601 functions as a reset transistor for resetting the wiring 112 (FD1) (or the wiring 132 (FD2)). Accordingly, unlike in the detection circuit in FIG. 3A, the reset operation using the photoelectric conversion element 100 is not performed, and a reverse bias is always applied to the photoelectric conversion element 100. The wiring 112 (FD1) and the wiring 132 (FD2) can be reset by setting the potential of the wiring 111 (PR) high.

The transistor 601 can be formed using a silicon semiconductor such as amorphous silicon, microcrystalline silicon, polycrystalline silicon, or single crystal silicon; however, when leakage current is large, the charge accumulation portion cannot hold charge long enough. For this reason, like the transistor 120, it is preferable to use a transistor including a semiconductor layer (at least a channel formation region) formed using an oxide semiconductor material, which achieves extremely low off-state current.

<Operation Flow Chart of Photodetector Circuit>

Next, an operation flow chart of the photodetector circuit illustrated in FIG. 3A will be described with reference to FIG. 3B.

First, as in the operation flow chart of the photodetector circuit described in Embodiment 1, reset operations and potential generation operations are performed in the first signal output circuit 301 and the second signal output circuit 302 from the time T1 to the time T6.

Next, at the time T7, output operations are performed in the first signal output circuit 301 and the second signal output circuit 302. Although the output operations are sequentially performed in the first signal output circuit 101 and the second signal output circuit 102 in Embodiment 1, in the operation flow chart of the photodetector circuit in this embodiment, the output operations are performed in the first signal output circuit 301 and the second signal output circuit 302 at a time (the potential (the signal 316S) of the wiring 316 (SE) is set high) as illustrated in FIG. 3B.

Thus, current corresponding to the gate potential of the transistor 120 flows between the source and the drain of the second switching element 122 in each of the first signal output circuit 301 and the second signal output circuit 302, whereby the potential (the signal 315S) of the wiring 315 (OUT1) and the potential (the signal 335S) of the wiring 335 (OUT2) are decreased.

Then, at the time T8, when the potential (the signal 316S) of the wiring 316 (SE) in the first signal output circuit 301 is set low (i.e., the output operation finishes), current flowing between the source and the drain of the second switching element 122 in each of the first signal output circuit 301 and the second signal output circuit 302 is stopped, so that the potential (the signal 315S) of the wiring 315 (OUT1) which serves as a transmission path of a detection signal output from the first signal output circuit 301 and the potential (the signal 335S) of the wiring 335 (OUT2) which serves as a transmission path of a detection signal output from the second signal output circuit each have a fixed value.

As illustrated in FIG. 3A, the wiring (wiring 316 (SE)) which controls the operation state of the second switching element 122 is shared by the first signal output circuit 301 and the second signal output circuit 302 and different wirings (the wiring 315 (OUT1) and the wiring 335 (OUT2)) are used in the first signal output circuit 301 and the second signal output circuit 302 as wirings for outputting detection signals, so that output of a detection signal from the first signal output circuit 301 and output of a detection signal from the second signal output circuit 302 can be performed at a time; thus, detection signals in different periods can be obtained in a short period.

The above is the description of the operation flow chart of the photodetector circuit in this embodiment.

<Different Operation Flow Chart of Photodetector Circuit>

Figure 3B:
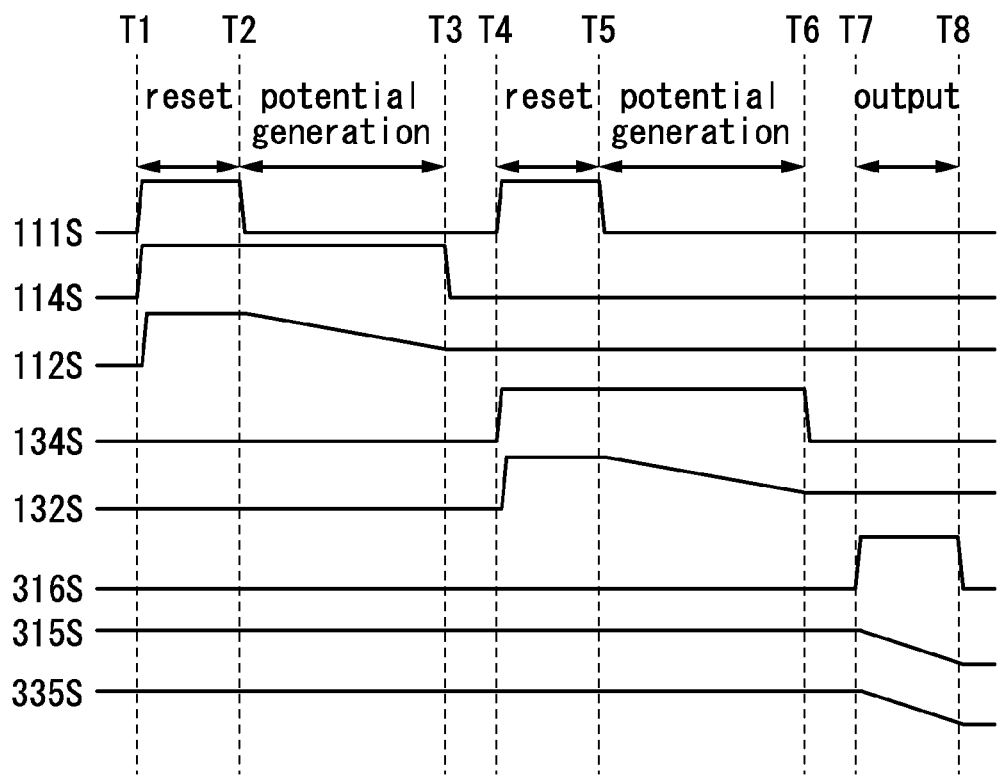

Note that the operation flow chart of the photodetector circuit described in FIG. 3A may be an operation flow chart different from the above operation flow chart described using FIG. 3B. The operation flow chart different from the above-described operation flow chart is described below using FIG. 4.

First, at a time T1, the potential (the signal 111S) of the wiring 111 is set high and the potential (the signal 114S) of the wiring 114 (TX1) in the first signal output circuit 301 and the potential (the signal 134S) of the wiring 134 (TX2) in the second signal output circuit 302 are set high (i.e., a reset operation starts).

In the operation flow chart described in FIG. 3B, reset operations are performed in the first signal output circuit 301 and the second signal output circuit 302 in separate steps. By performing reset operations in the first signal output circuit 301 and the second signal output circuit 302 at the same time as illustrated in FIG. 4, a period from the reset operation start to the output operation end (period from the time T1 to the time T8) can be shortened, so that detection signals in different periods can be obtained in a short period.

Note that since the following operation flow chart is the same as that in the above operation flow chart described using FIG. 3B except for the operation flow chart between the time T4 and the time T5, the operation flow chart described using FIG. 3B can be referred to for the following operation flow chart.

The above is the description of the different operation flow chart of the photodetector circuit.

Embodiment 3

In this embodiment, examples of the configuration of an integrator circuit used to be connected to the wiring 115 (OUT) in Embodiment 1, and the wiring 315 (OUT 1) and the wiring 335 (OUT2) in Embodiment 2.

Figure 7A:
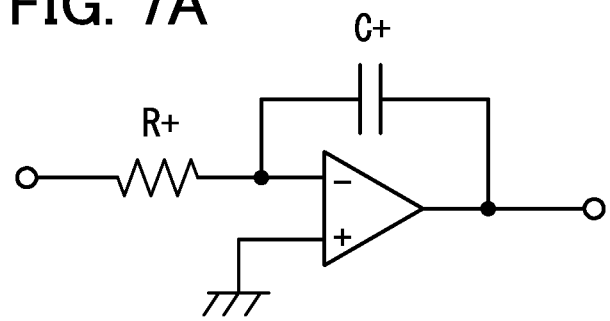
FIGS. 7A to 7C each illustrate an operational amplifier circuit.

FIG. 7A illustrates an integrator circuit including an operational amplifier circuit (also referred to as an op-amp). An inverting input terminal of the operational amplifier circuit is connected to the wiring 115 (OUT), the wiring 315 (OUT 1), and the wiring 335 (OUT2) through a resistor R. A non-inverting input terminal of the operational amplifier circuit is grounded. An output terminal of the operational amplifier circuit is connected to the inverting input terminal of the operational amplifier circuit through a capacitor C.

Here, the operational amplifier circuit is assumed to be an ideal operational amplifier circuit. In other words, it is assumed that input impedance is infinite (the input terminals draw no current). Since the potential of the non-inverting input terminal and the potential of the inverting input terminal are equal in a steady state, the potential of the inverting input terminal can be considered as a ground potential.

Relations (1), (2), and (3) are satisfied, where Vi is the potential of each of the wiring 115 (OUT), the wiring 315 (OUT1), and the wiring 335 (OUT2), Vo is the potential of the output terminal of the operational amplifier circuit, i1 is a current flowing through the resistor R, and i2 is a current flowing through the capacitor C.

$$Vi = i1 \cdot R \tag{1}$$

$$i2 = C \cdot dVo/dt \tag{2}$$

$$i1 + i2 = 0 \tag{3}$$

Here, when charge in the capacitor C is discharged at the time t=0, the potential Vo of the output terminal of the operational amplifier circuit at the time t=t is expressed by (4).

$$Vo = -(1/CR)\int Vi \, dt \tag{4}$$

In other words, with a longer time t (integral time), the potential (Vi) to be read can be raised and output as the detection signal Vo. Moreover, lengthening of the time t corresponds to averaging of thermal noise or the like and can increase S/N of the detection signal Vo.

In a real operational amplifier circuit, a bias current flows even when a signal is not input to the input terminals, so that an output voltage is generated at the output terminal and charge is accumulated in the capacitor C. It is therefore effective to connect a resistor in parallel with the capacitor C so that the capacitor C can be discharged.

Figure 7B:
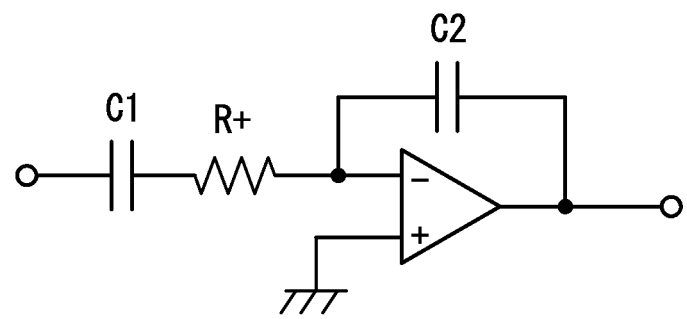

FIG. 7B illustrates an integrator circuit including an operational amplifier circuit having a structure different from that in FIG. 7A. An inverting input terminal of the operational amplifier circuit is connected to the wiring 115 (OUT), the wiring 315 (OUT1), and the wiring 335 (OUT2), through a resistor R and a capacitor C1. A non-inverting input terminal of the operational amplifier circuit is grounded. An output terminal of the operational amplifier circuit is connected to the inverting input terminal of the operational amplifier circuit through a capacitor C2.

Here, the operational amplifier circuit is assumed to be an ideal operational amplifier circuit. In other words, it is assumed that input impedance is infinite (the input terminals draw no current). Since the potential of the non-inverting input terminal and the potential of the inverting input terminal are equal in a steady state, the potential of the inverting input terminal can be considered as a ground potential.

Relations (5), (6), and (7) are satisfied, where Vi is the potential of each of the wiring 115 (OUT), the wiring 315 (OUT1), and the wiring 335 (OUT2), Vo is the potential of the output terminal of the operational amplifier circuit, i1 is a current flowing through the resistor R and the capacitor C1, and i2 is a current flowing through the capacitor C2.

$$Vi=(1/C1)\int i1 dt + i1 \cdot R \quad (5)$$

$$i2 = C2 \cdot dVo/dt \quad (6)$$

$$i1 + i2 = 0 \quad (7)$$

Here, assuming that charge in the capacitor C2 is discharged at the time t=0, the potential Vo of the output terminal of the operational amplifier circuit at the time t=t is expressed by (9) when (8) is met, which corresponds to a high-frequency component, and (11) when (10) is met, which corresponds to a low-frequency component.

$$Vo << dVo/dt \quad (8)$$

$$Vo = -(1/C2) \int Vi dt \quad (9)$$

$$Vo >> dVo/dt \quad (10)$$

$$Vo = -C1/C2 \cdot Vi \quad (11)$$

In other words, by appropriately setting the capacitance ratio of the capacitor C1 to the capacitor C2, the potential (Vi) to be read can be raised and output as the detection signal Vo. Further, a high-frequency noise component of the input signal can be averaged by time integration, and S/N of the detection signal Vo can be increased.

In a real operational amplifier circuit, a bias current flows even when a signal is not input to the input terminals, so that an output voltage is generated at the output terminal and charge is accumulated in the capacitor C2. It is thus effective to connect a resistor in parallel with the capacitor C2 so that the capacitor C2 can be discharged.

Figure 7C:
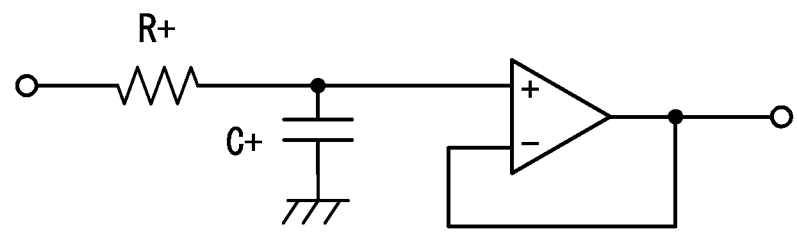

FIG. 7C illustrates an integrator circuit including an operational amplifier circuit having a structure different from those in FIGS. 7A and 7B. A non-inverting input terminal of the operational amplifier circuit is connected to the wiring 115 (OUT), the wiring 315 (OUT1), and the wiring 335 (OUT2) through a resistor R and is grounded through a capacitor C. An output terminal of the operational amplifier circuit is connected to an inverting input terminal of the operational amplifier circuit. The resistor R and the capacitor C constitute a CR integrator circuit. The operational amplifier circuit is a unity gain buffer.

A relation (12) holds, where Vi is the potential of each of the wiring 115 (OUT), the wiring 315 (OUT1), and the wiring 335 (OUT2) and Vo is the potential of the output terminal of the operational amplifier circuit. Although Vo is saturated at the value of Vi, a noise component included in the input signal Vi can be averaged by the CR integrator circuit, and as a result, S/N of the detection signal Vo can be increased.

$$Vo = (1/CR) \int Vi dt \quad (12)$$

The above are the examples of the configuration of the integrator circuit used to be connected to each of the wiring 115 (OUT), the wiring 315 (OUT1), and the wiring 335 (OUT2). Connecting the above-described integrator circuit to the wiring 115 (OUT), the wiring 315 (OUT1), and the wiring 335 (OUT2) increases S/N of the detection signal and enables weaker light to be detected; thus, a more accurate image signal can be generated in the semiconductor device.

Embodiment 4

In this embodiment, an example of the layout of the photodetector circuit in FIG. 1A and FIG. 3A described in Embodiment 1 will be described with reference to FIGS. 8A and 8B and FIGS. 9A and 9B.

<Example of Layout of Photodetector Circuit in FIG. 1A>

FIG. 8A is a top view of the photodetector circuit illustrated in FIG. 1A, and FIG. 8B is a cross-sectional view along the dashed-dotted line A1-A2 in FIG. 8A.

The photodetector circuit includes, over a substrate 860 on which an insulating film 861 is formed, a conductive film 811 serving as the wiring 111 (PR), a conductive film 812 serving as the wiring 112 (FD 1) in the first signal output circuit 101, a conductive film 832 serving as the wiring 132 (FD2) in the second signal output circuit 102, a conductive film 813 serving as the wiring 113 (VR), a conductive film 814 serving as the wiring 114 (TX1) in the first signal output circuit 101, a conductive film 834 serving as the wiring 134 (TX2) in the second signal output circuit 102, a conductive film 815 serving as the wiring 115 (OUT), a conductive film 816 serving as the wiring 116 (SE1) in the first signal output circuit 101, and a conductive film 836 serving as the wiring 136 (SE2) in the second signal output circuit 102.

The photoelectric conversion element 100 includes a p-type semiconductor film 801, an i-type semiconductor film 802, and an n-type semiconductor film 803 that are stacked in this order.

The conductive film 811, which serves as the wiring 111 (PR), is electrically connected to the p-type semiconductor film 801 that functions as one of the electrodes (the anode) of the photoelectric conversion element 100.

A conductive film 841 functions as a wiring for connecting one of the source and the drain of the transistor 120 to the conductive film 813.

A conductive film 842 functions as one of the source and the drain of the first switching element 121.

A conductive film 843 functions as a wiring for connecting one of the source and the drain of the first switching element 121 in the first signal output circuit 101 to one of the source and the drain of the first switching element 121 in the second signal output circuit 102.

A conductive film 844 functions as one of the source and the drain of the transistor 120.

A conductive film 845 functions as the other of the source and the drain of the first switching element 121.

A conductive film 846 functions as a wiring for connecting the other of the source and the drain of the transistor 120 to one of the source and the drain of the second switching element 122.

A conductive film 847 functions as the gate of the second switching element 122 in the first signal output circuit 101.

A conductive film 848 functions as the gate of the second switching element 122 in the second signal output circuit 102.

A conductive film 849 functions as a wiring for connecting the gate of the second switching element 122 in the first signal output circuit 101 to the conductive film 816.

A conductive film 850 functions as a wiring for connecting the gate of the second switching element 122 in the second signal output circuit to the conductive film 836.

The conductive films 812, 814, 816, 832, 834, 836, 841, 843, 847, and 848 can be formed by processing one conductive film formed over an insulating surface into a desired shape. Over these conductive films, a gate insulating film 862 is formed. Further, the conductive films 811, 813, 815, 842, 844, 845, 846, 849, and 850 can be formed by processing one conductive film formed over the gate insulating film 862 into a desired shape.

Over the conductive films 811, 813, 815, 842, 844, 845, 846, 849, and 850, an insulating film 863 and an insulating film 864 are formed, and over the insulating films 863 and 864, a conductive film 870 is formed.

It is preferable to use an oxide semiconductor for a semiconductor layer 880 of the first switching element 121. In order to hold charge generated by light entering the photoelectric conversion element 100 in the conductive film 812 (FD1) (or the conductive film 832 (FD2)) for a long time, a transistor having extremely low off-state current is preferably used as the first switching element 121 electrically connected to the conductive film. For that reason, the use of an oxide semiconductor material for the semiconductor layer 880 can increase the performance of the photodetector circuit.

In the photodetector circuit in FIGS. 8A and 8B, the elements such as the transistors and the photoelectric conversion element 100 may overlap each other. This configuration can increase the pixel density and thus can increase the resolution of an imaging device. In addition, the area of the photoelectric conversion element 100 can be increased, and the sensitivity of the imaging device can be increased as a result.

<Example of Layout of Photodetector Circuit in FIG. 3A>

Figure 9A:
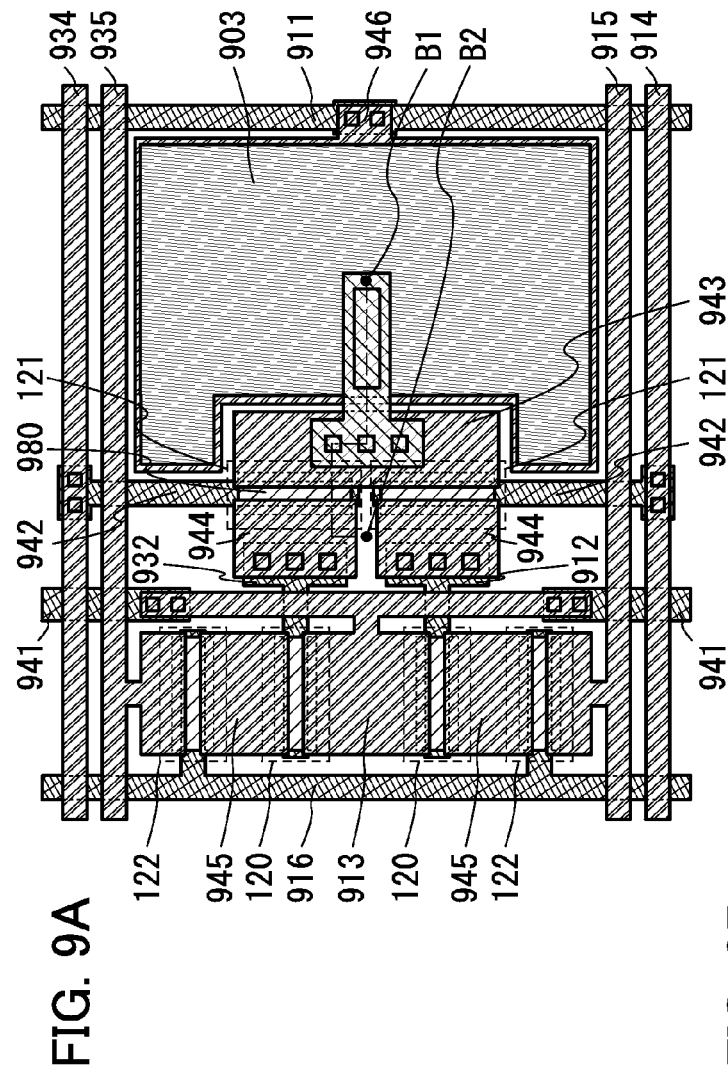
FIGS. 9A and 9B illustrate a layout of a photodetector circuit.
Figure 9B:
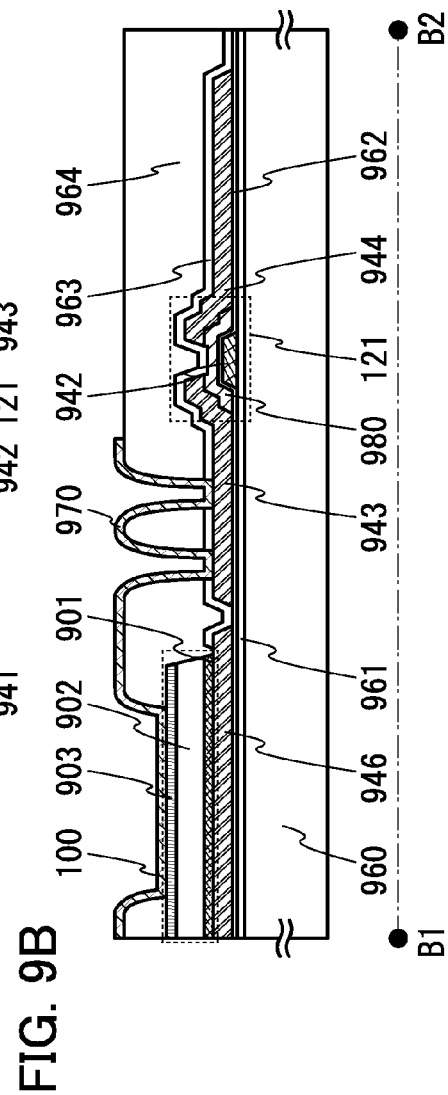

FIG. 9A is a top view of the photodetector circuit illustrated in FIG. 3A, and FIG. 9B is a cross-sectional view along the dashed-dotted line B1-B2 in FIG. 9A.

The photodetector circuit includes, over a substrate 960 on which an insulating film 961 is formed, a conductive film 911 serving as the wiring 111 (PR), a conductive film 912 serving as the wiring 112 (FD1) in the first signal output circuit 301, a conductive film 932 serving as the wiring 132 (FD2) in the second signal output circuit 302, a conductive film 913 serving as the wiring 113 (VR), a conductive film 914 serving as the wiring 114 (TX1) in the first signal output circuit 301, a conductive film 934 serving as the wiring 134 (TX2) in the second signal output circuit 302, a conductive film 915 serving as the wiring 315 (OUT 1) in the first signal output circuit 301, a conductive film 935 serving as the wiring 335 (OUT2) in the second signal output circuit 302, and a conductive film 916 serving as the wiring 316 (SE).

The photoelectric conversion element 100 includes a p-type semiconductor film 901, an i-type semiconductor film 902, and an n-type semiconductor film 903 that are stacked in this order.

The conductive film 911, which serves as the wiring 111 (PR), is electrically connected to the p-type semiconductor film 901 that functions as one of the electrodes (the anode) of the photoelectric conversion element 100.

A conductive film 941 is connected to the conductive film 913 serving as the wiring 113 (VR) and functions as part of the wiring 113 (VR).

A conductive film 942 is connected to the conductive film 914 serving as the wiring 114 (TX1) or the conductive film 934 serving as the wiring 134 (TX2), and functions as the gate of the first switching element 121.

A conductive film 943 functions as one of the source and the drain of the first switching element 121.

A conductive film 944 functions as the other of the source and the drain of the first switching element 121.

A conductive film 945 functions as the other of the source and the drain of the transistor 120 and one of the source and the drain of the second switching element 122.

A conductive film 946 functions as a wiring for connecting the conductive film 911 to the p-type semiconductor film 901.

The conductive films 911, 912, 916, 932, 941, and 942 can be formed by processing one conductive film formed over an insulating surface into a desired shape. Over these conductive films, a gate insulating film 962 is formed. Further, the conductive films 913, 914, 915, 934, 935, 943, 944, 945, and 946 can be formed by processing one conductive film formed over the gate insulating film 962 into a desired shape.

Further, over the conductive films 911, 912, 916, 932, 941, and 942, an insulating film 963 and an insulating film 964 are formed, and over the insulating films 963 and 964, a conductive film 970 is formed.

It is preferable to use an oxide semiconductor for a semiconductor layer 980 of the first switching element 121. In order to hold charge generated by light entering the photoelectric conversion element 100 in the conductive film 912 (FD 1) (or the conductive film 932 (FD2)) for a long time, a transistor having extremely low off-state current is preferably used as the first switching element 121 electrically connected to the conductive film. For that reason, the use of an oxide semiconductor material for the semiconductor layer 980 can increase the performance of the photodetector circuit.

In the photodetector circuit in FIGS. 8A and 8B, the elements such as the transistors and the photoelectric conversion element 100 may overlap each other. This configuration can increase the pixel density and thus can increase the resolution of an imaging device. In addition, the area of the photoelectric conversion element 100 can be increased, and the sensitivity of the imaging device can be increased as a result.

This embodiment can be combined with any of the other embodiments disclosed in this specification as appropriate.

Embodiment 5

The photodetector circuit described in any of the above embodiments can be provided in a variety of semiconductor devices. In this embodiment, as an example of a semiconductor device including a photodetector circuit, a radiation imaging device in which adverse effect of afterglow is reduced by including the photodetector circuit described in any of the above embodiments will be described with reference to FIGS. 10A and 10B and FIGS. 11A to 11D.

Further, an image display device having a touch panel function obtained by including the photodetector circuit described in any of the above embodiments will be described with reference to FIG. 12, FIG. 13, and FIGS. 14A and 14B.

<Structure Example of Radiation Imaging Device>

A structure of a radiation imaging device including the photodetector circuit described in any of the above embodiments will be described with reference to FIGS. 10A and 10B and FIGS. 11A to 11D.

Figure 10A:
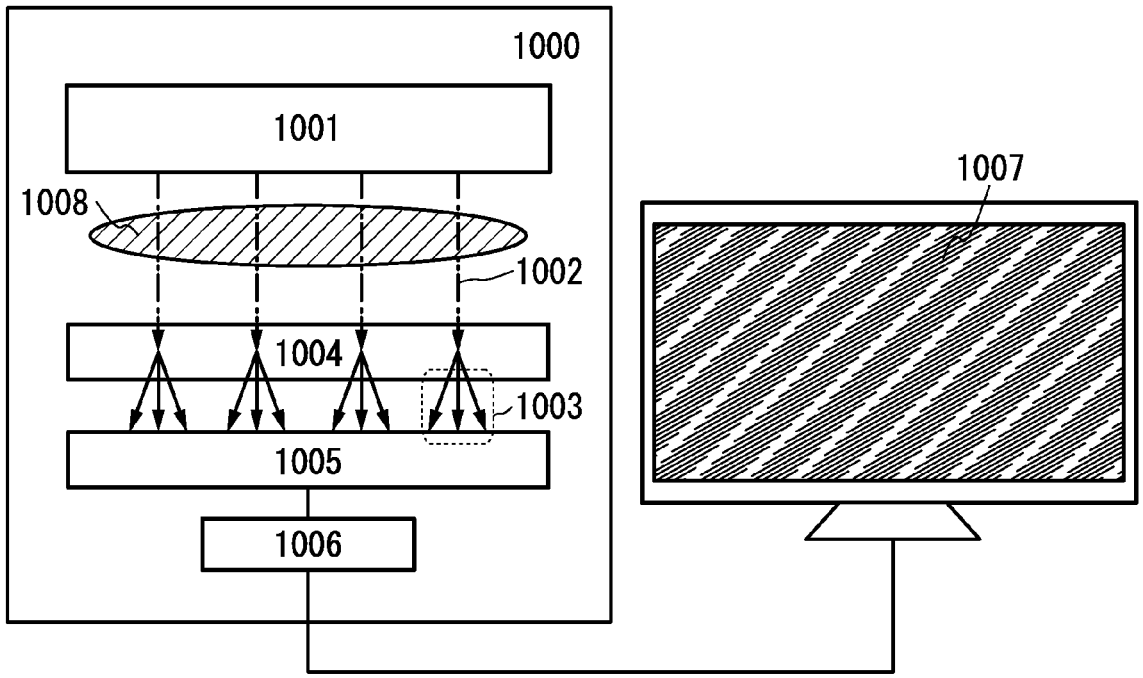
FIGS. 10A and 10B illustrate a structure of a radiation imaging device.

As illustrated in FIG. 10A, a radiation imaging device 1000 includes a radiation emission portion 1001, a scintillator 1004 which receives radiation 1002 output from the radiation emission portion 1001 and outputs light 1003, a photodetector mechanism 1005 which outputs a detection signal corresponding to the amount of incident light 1003, and an image signal generation portion 1006 which generates an image signal by using a detection signal output from the photodetector mechanism 1005. Further, the radiation imaging device 1000 is connected to an image display device 1007 and the image display device 1007 receives an image signal output from the image signal generation portion 1006, so that internal data and the like of an object 1008 is displayed on the image display device 1007.

A structure example of the photodetector mechanism 1005 will be described below with reference to FIG. 10B.

<Structure Example of Photodetector Mechanism>

The photodetector mechanism 1005 described in this embodiment includes a photodetector portion 1010 in which photodetector circuits 1012 are arranged in a matrix of m rows and n columns, and a photodetector circuit control portion 1020 including a first photodetector circuit driver 1021 and a second photodetector circuit driver 1022 for controlling the photodetector circuits 1012.

As the photodetector circuit 1012, the photodetector circuit illustrated in FIG. 1A is used (needless to say, the photodetector circuit 1012 is not limited thereto).

The first photodetector circuit driver 1021 has a function of generating a signal output to the wiring 113 (VR) and the wiring 111 (PR) and a function of extracting detection signals, which are output from the first signal output circuit 101 and the second signal output circuit 102, from the wiring 115 (OUT) in a selected row. Note that the first photodetector circuit driver 1021 is connected to the image signal generation portion 1006 which generates an image signal that is less affected by afterglow.

In addition, the first photodetector circuit driver 1021 includes a precharge circuit, and has a function of setting the potential of the wiring 115 (OUT) to a predetermined potential. Note that the first photodetector circuit driver 1021 can have a structure in which output of an analog signal from a photodetector circuit is extracted as it is to the outside of the radiation imaging device 1000 with the use of an operational amplifier or the like or a structure in which an analog signal is converted into a digital signal with the use of an A/D converter circuit and extracted to the outside of the radiation imaging device 1000.

The second photodetector circuit driver 1022 has a function of generating a signal output to the wiring 114 (TX1), the wiring 134 (TX2), the wiring 116 (SE1), and the wiring 136 (SE2).

The above is the description of the structure example of the photodetector mechanism 1005.

<Operation Example of Radiation Imaging Device>

Next, an example of the operation of the radiation imaging device 1000 having the above-described structure will be described with reference to FIGS. 11A to 11D.

In the case where moving images, for example, for monitoring blood flow in vessels or temporally continuous still images are taken with a radiation imaging device, it is necessary to increase the time resolution of the radiation imaging device to obtain high-definition images; thus, it is desired that a period after stop of radiation emission before start of the next radiation emission be as short as possible.

However, in the case where the period after stop of radiation emission before start of the next radiation emission is short, light due to afterglow is output from a scintillator at the start of the next radiation emission in some cases.

When radiation emission starts in such a state, light output from the scintillator is a combination of light obtained by radiation emission and light due to afterglows of previous and earlier radiation emission; thus, a difference may arise between the amount of radiation through the object 1008, which is received by the scintillator 1004, and data corresponding to the amount of radiation received by the photodetector mechanism 1005, which is output from the photodetector mechanism 1005.

Figure 11A:
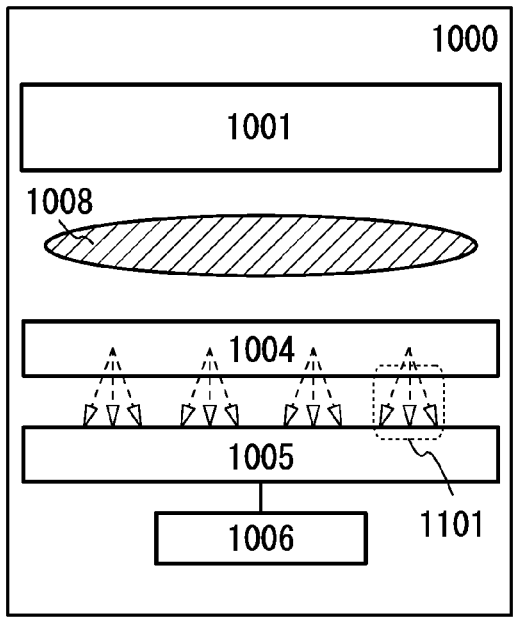
FIGS. 11A to 11D illustrate operations of a radiation imaging device.
Figure 11B:
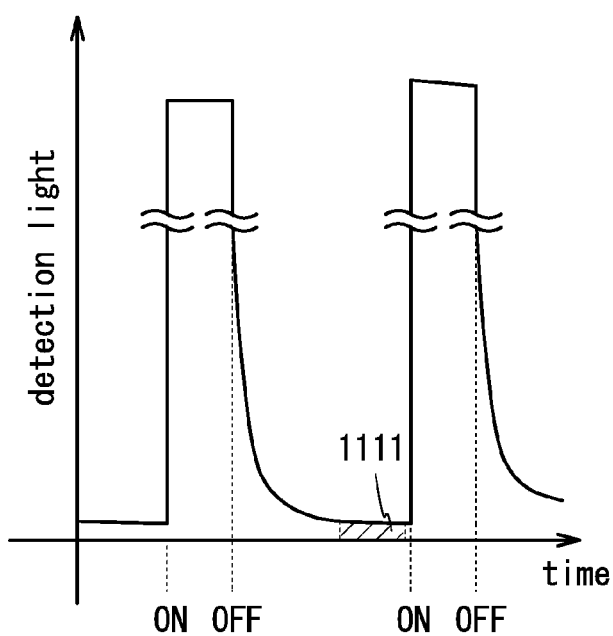

In view of the above, first, as illustrated in FIGS. 11A and 11B, light 1101 output from the scintillator 1004 in a period 1111 just before the start of the next radiation emission is received by the photoelectric conversion element 100 in each of the photodetector circuits 1012 and potentials (data) (hereinafter, also referred to as potentials A) based on the amount of incident light are held in the first signal output circuits 101.

The light 1101 output from the scintillator 1004 in the period 1111 can be regarded as light due to afterglows of the previous and earlier radiation emission.

Figure 11C:
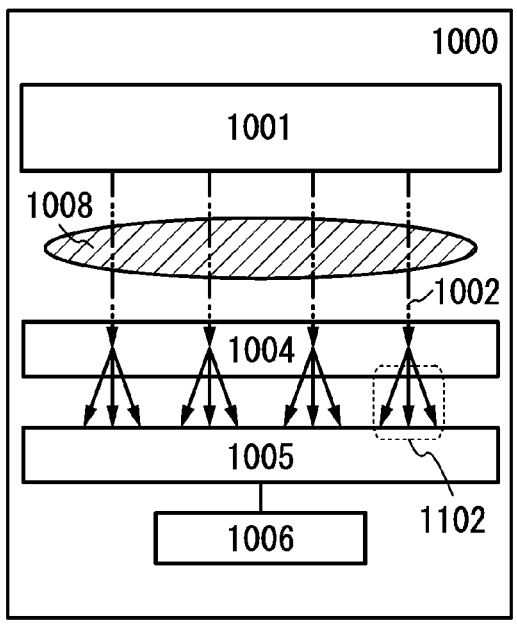
Figure 11D:
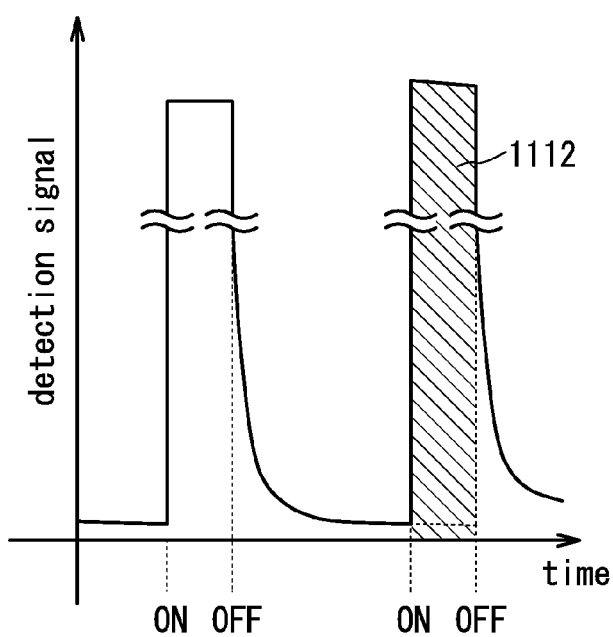

Next, as illustrated in FIGS. 11C and 11D, light 1102 output from the scintillator 1004 in a period 1112 during which the next radiation emission is performed is received by the photoelectric conversion element 100 in each of the photodetector circuits 1012 and potentials (data) (hereinafter, also referred to as potentials B) based on the amount of incident light are held in the second signal output circuits 102.

The light 1102 output from the scintillator 1004 in the period 1112 can be regarded as light due to afterglows of the previous and earlier radiation emission.

Next, after the potentials A and the potentials B are held in all the photodetector circuits 1012, a detection signal including the potential A as data and a detection signal including the potential B as data are output from each of the photodetector circuits 1012 to the image signal generation portion 1006.

Then, in the image signal generation portion 1006, an image signal (for one pixel) is generated using a difference between the two detection signals input from each of the photodetector circuits 1012 and imaging data is displayed on the image display device 1007 with the use of the image signal.

Here, the photodetector circuit 1012 has a structure in which one photoelectric conversion element and one signal output circuit are provided.

In the structure, when data held in the signal output circuit remains in the period 1111, a potential (data) in the period 1112 cannot be obtained accurately. In other words, since a potential (data) in the period 1112 is added to a potential (data) in the period 1111, output of a detection signal corresponding to the potential (data) (an output operation) and reset of the potential (data) held in the signal output circuit (an reset operation) are necessarily performed before the start of the period 1112.

Since the amount of light emitted by afterglow is decreased as time passes, as an interval from the end of the period 1111 to the start of the period 1112 increases, an accurate image signal is less likely to be obtained when an image signal is generated using a difference between two detection signals as described above. Particularly in the case where the amount of temporal change of afterglow is large, the above problem becomes significant.

In contrast, in the case where in the photodetector circuit 1012, the two signal output circuits (the first signal output circuit 101 and the second signal output circuit 102) are connected to the photoelectric conversion element 100 as illustrated in FIG. 1A, turning off the first switching element 121 in the first signal output circuit 101 enables a potential (data) in the period 1111 to be held in the first signal output circuit 101 and further, only performing a reset operation on the second signal output circuit 102 after the period 1111 enables a potential (data) in the period 1112 to start to be obtained using the photoelectric conversion element 100 and the second signal output circuit 102. Note that in the case where the photodetector circuit illustrated in FIG. 3A is used, a reset operation performed after the period 1111 is not necessary in some cases.

Thus, an image signal generated using a difference between two detection signals input from each of the photodetector circuits 1012 is an accurate image signal that is less affected by afterglow.

The above is the description of the radiation imaging device including the photodetector circuit described in any of the above embodiments.

Figure 10B:
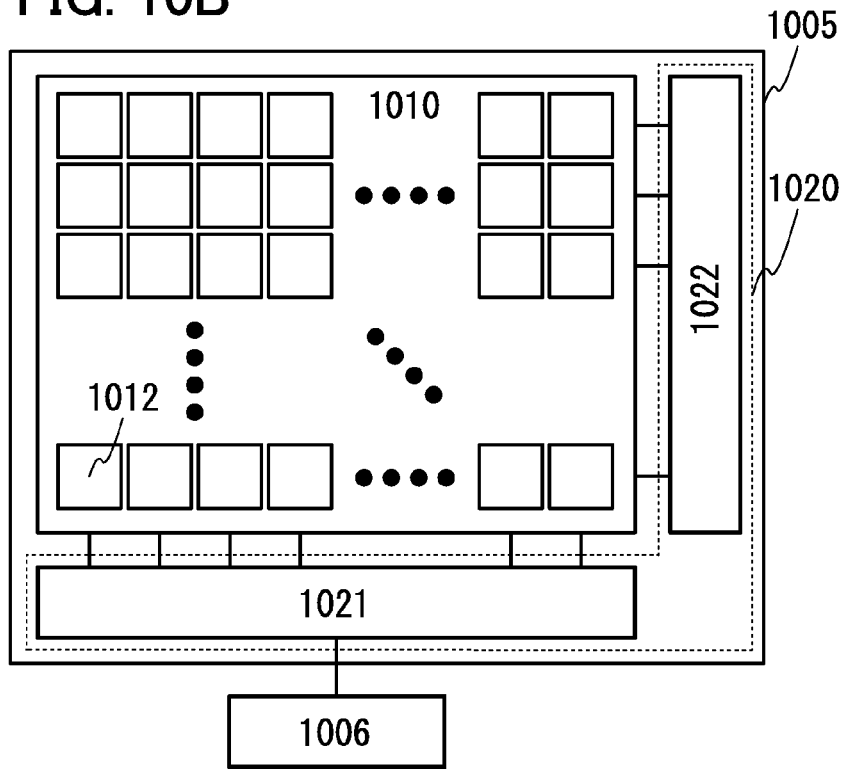

Although the image signal generation portion 1006 is provided in the radiation imaging device 1000 so as to be connected to the photodetector mechanism 1005 in FIGS. 10A and 10B, the image signal generation portion 1006 may be provided in the photodetector mechanism 1005. Alternatively, the image signal generation portion 1006 may be provided outside the radiation imaging device 1000.

Further, although the image display device 1007 is provided outside the radiation imaging device 1000 in FIGS. 10A and 10B, the image display device 1007 may be provided in the radiation imaging device 1000.

<Structure Example of Image Display Device>

Figure 12:
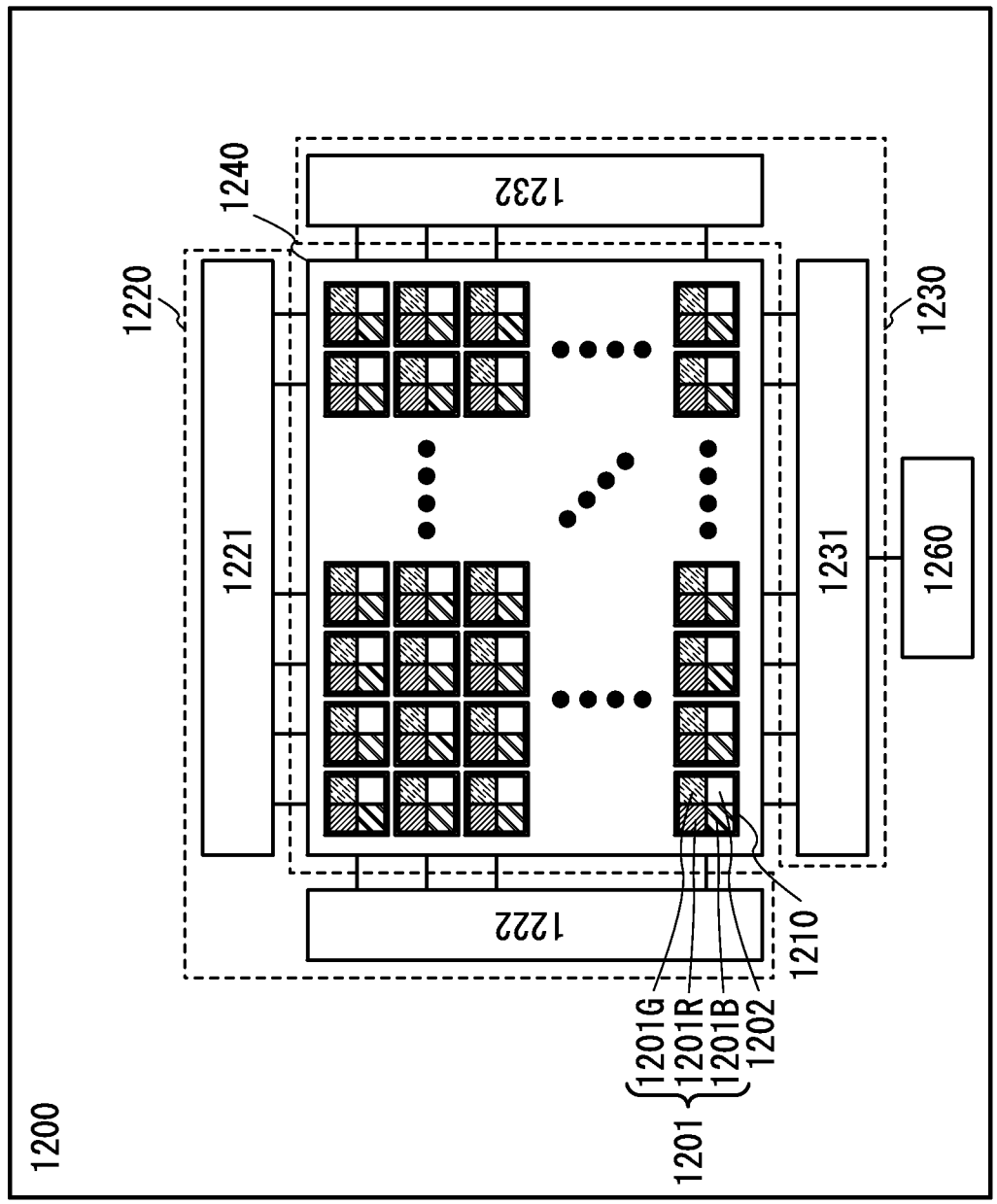
FIG. 12 illustrates a structure of an image display device.

FIG. 12 illustrates an example of a structure of an image display device including a plurality of pixels and a driver for driving the plurality of pixels.

An image display device 1200 includes a display portion 1240, a display element control portion 1220, and a photodetector circuit control portion 1230. The display portion 1240 includes a plurality of pixels 1210 arranged in a matrix.

FIG. 12 illustrates an example where the pixel 1210 includes one display element 1201R emitting red light, one display element 1201G emitting green light, one display element 1201B emitting blue light, and one photodetector circuit 1202. The structure of the photodetector circuit 1202 can be similar to that described in any of the above embodiments can be used.

An example of a configuration of the pixel 1210 is described below with reference to FIG. 13.

<Configuration Example of Pixel>

The pixel 1210 described in this embodiment includes three display elements (the display element 1201R, the display element 1201G, and the display element 1201B) and one photodetector circuit 1202. Using the pixel 1210 as a basic configuration, a plurality of pixels 1210 are arranged in a matrix of m rows and n columns and form a display screen that also serves as a data input region. FIG. 13 illustrates an example of the case where the photodetector circuit having the configuration in FIG. 1A is used as the photodetector circuit 1202 in the pixel 1210.

Figure 13:
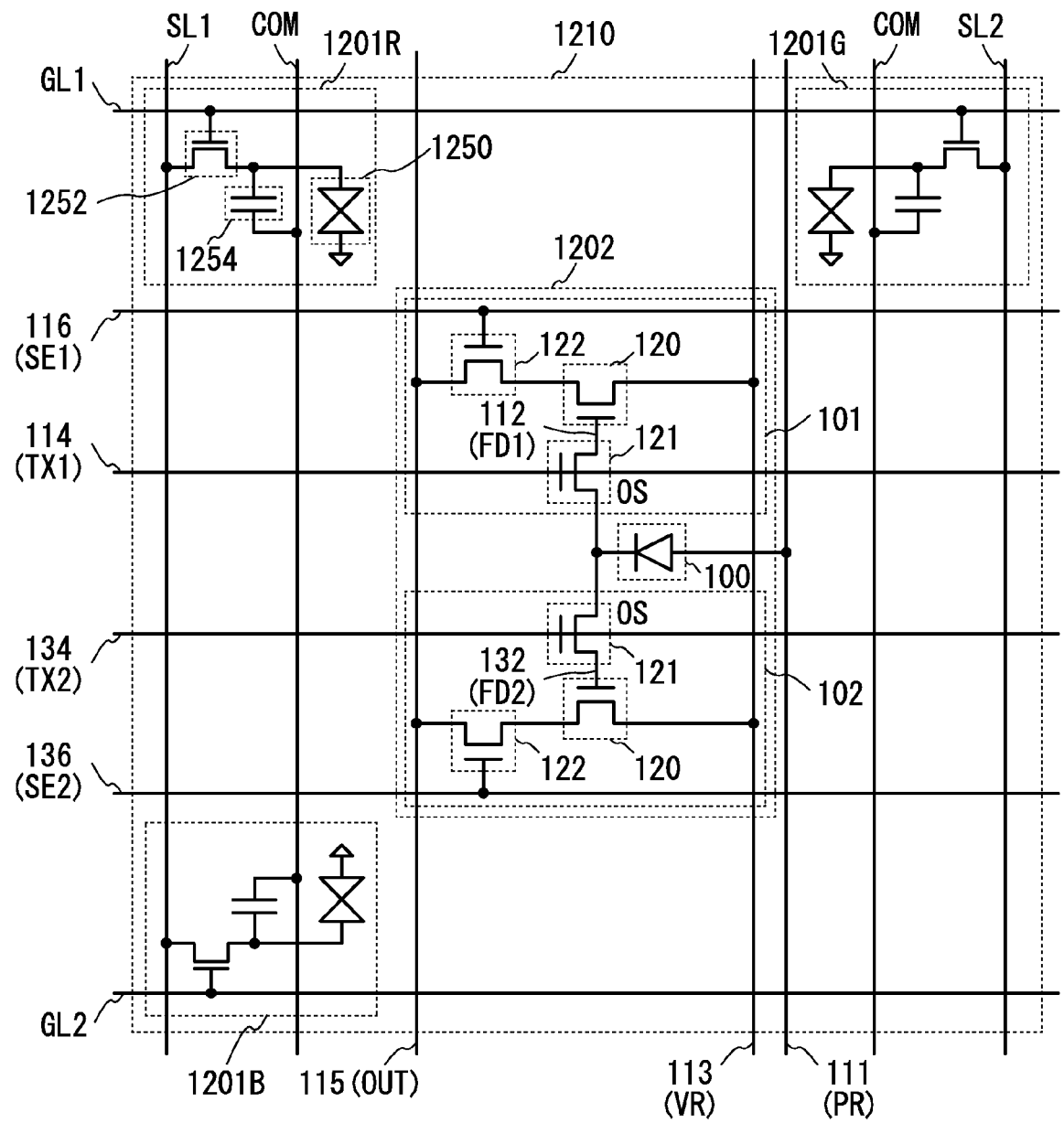
FIG. 13 illustrates a configuration of an image display device.

Note that the number of display elements and the number of photodetector circuits included in each pixel is not limited to those illustrated in FIG. 13. The density of the photodetector circuits and that of the display elements may be the same or different. That is, one photodetector circuit may be provided for one display element; one photodetector circuit may be provided for two or more display elements; or one display element may be provided for two or more photodetector circuits.

FIG. 13 illustrates a configuration where the display element 1201R, the display element 1201G, and the display element 1201B each include a liquid crystal element 1250 is illustrated as an example. The display element 1201R, the display element 1201G, and the display element 1201B each include the liquid crystal element 1250, a transistor 1252 serving as a switching element for controlling the operation of the liquid crystal element 1250, and a capacitor 1254. The liquid crystal element 1250 includes a pixel electrode, a counter electrode, and a liquid crystal layer to which a voltage is applied by the pixel electrode and the counter electrode.

Although not illustrated, a red color filter, a green color filter, and a blue color filter are provided on the light extraction side of the liquid crystal element 1250 in the display element 1201R, the liquid crystal element 1250 in the display element 1201G, and the liquid crystal element 1250 in the display element 1201B, respectively.

A gate of the transistor 1252 is connected to a scan line GL (GL1 or GL2). One of a source and a drain of the transistor 1252 is connected to a signal line SL (SL1 or SL2), and the other of the source and the drain of the transistor 1252 is connected to a pixel electrode of the liquid crystal element 1250. One of a pair of electrodes of the capacitor 1254 is connected to the pixel electrode of the liquid crystal element 1250, and the other of the pair of electrodes of the capacitor 1254 is connected to a wiring COM supplied with a fixed potential. The signal line SL is supplied with a potential corresponding to an image to be displayed. When the transistor 1252 is turned on with a signal of the scan line GL, the potential of the signal line SL is supplied to one of the pair of the electrodes of the capacitor 1254 and the pixel electrode of the liquid crystal element 1250. The capacitor 1254 holds charge corresponding to voltage applied to the liquid crystal layer. Contrast (gray scale) of light passing through the liquid crystal layer is made by utilizing the change in the polarization direction of the liquid crystal layer with voltage application, and images are displayed. As light passing through the liquid crystal layer, light emitted from the backlight is used.

In the configuration in FIG. 13, the operation of the display elements arranged in a matrix can be similar to that in a known display device.

Note that as the transistor 1252, the transistor including an oxide semiconductor material in a channel formation region, which is described in any of the above embodiments, can be used. In the case of using the transistor, since its off-state current is extremely low, the capacitor 1254 is not necessarily provided.

Note that each of the display elements 1201R, 1201G, and 1201B may further include another circuit element such as a transistor, a diode, a resistor, a capacitor, or an inductor as needed.

Although FIG. 13 illustrates the case where the display element 1201R, the display element 1201G, and the display element 1201B each include the liquid crystal element 1250, another element such as a light-emitting element may be included. The light-emitting element is an element whose luminance is controlled with current or voltage, and specific examples thereof are a light emitting diode and an organic light-emitting diode (OLED).

The above is the description of the configuration example of the pixel 1210.

The display element control portion 1220 includes a first display element driver 1221 which has a function of controlling the display elements 1201 and inputs a signal to the display element 1201 through a signal line through which an image signal is transmitted (also referred to as a "source signal line") and a second display element driver 1222 which inputs a signal to the display element 1201 through a scan line (also referred to as a "gate signal line"). For example, the first display element driver 1221 has a function of giving a predetermined potential to the display elements 1201 in the pixels 1210 placed in the selected line. Further, the second display element driver 1222 has a function of selecting the display elements 1201 included in the pixels placed in a particular row.

The photodetector circuit control portion 1230 includes drivers for controlling the photodetector circuits 1202, and specifically a first photodetector circuit driver 1231 which faces the first display element driver 1221 with the display portion 1240 provided therebetween, and a second photodetector circuit driver 1232 which faces the second display element driver 1222 with the display portion 1240 provided therebetween.

The first photodetector circuit driver 1231 has a function of generating a signal output to the wiring 111 (PR) and the wiring 113 (VR) and a function of extracting an output signal of a photodetector circuit in the pixel 1210 in a selected row from the wiring 115 (OUT). Note that the first photodetector circuit driver 1231 is connected to a detection signal comparison portion 1260 which determines whether an object to be detected exists over each pixel 1210 or not with the use of a plurality of detection signals output from each pixel 1210.

In addition, the first photodetector circuit driver 1231 includes a precharge circuit, and has a function of setting the potential of the wiring 115 (OUT) to a predetermined potential. Note that the first photodetector circuit driver 1231 can have a structure in which output of an analog signal from a photodetector circuit is extracted as it is to the outside of the image display device 1200 with the use of an operational amplifier or the like or a structure in which an analog signal is converted into a digital signal with the use of an A/D converter circuit and extracted to the outside of the image display device 1200.

The second photodetector circuit driver 1232 has a function of generating a signal output to the wiring 114 (TX1), the wiring 134 (TX2), the wiring 116 (SE1), and the wiring 136 (SE2).

The above is the description of the configuration example of the image display device 1200.

<Operation Example of Image Display Device>

Next, an example of the operation of the image display device having the above-described configuration will be described with reference to FIGS. 14A and 14B.

The photodetector circuit 1202 provided in the image display device 1200 can hold potentials (data) including the amount of light entering the photoelectric conversion element 100 in given periods as data in accordance with the number of signal output circuits included in the photodetector circuit 1202, as described in the above embodiments.

For example, in the photodetector circuit in FIG. 13, potentials (data) in two periods can be held by using the first signal output circuit 101 and the second signal output circuit 102. Note that in this embodiment, the two periods are denoted by a period A and a period B, and the period B comes after the period A.

Figure 14A:
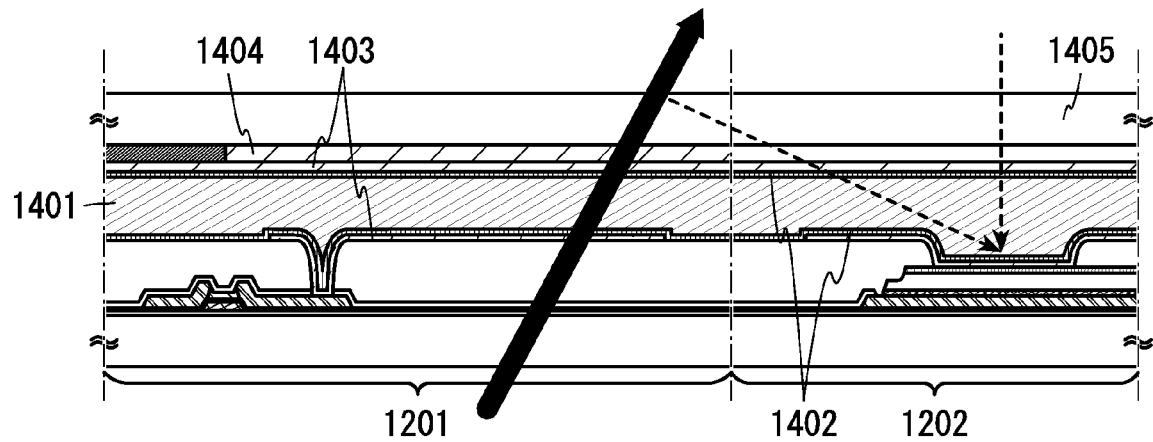
FIGS. 14A and 14B illustrate operations of an image display device.

The period A is a period during which an object to be detected, such as a finger, does not exist over the display element 1201 as illustrated in FIG. 14A. Light (image) output from the display element 1201 with the use of the first display element driver 1221 and the second display element driver 1222 is output to the outside through a liquid crystal layer 1401, a pair of alignment films 1402 between which the liquid crystal layer 1401 is sandwiched, a pair of electrodes 1403 between which the pair of alignment films 1402 are sandwiched, a color filter 1404, a substrate 1405, and the like.

Thus, slightly reflected light which is reflected by the substrate 1405 or the like, external light, or the like is input to the photodetector circuit 1202, and a potential (data) (hereinafter, also referred to as a potential C) including the amount of incident light in the period A as data is held in the first signal output circuit 101.

Figure 14B:
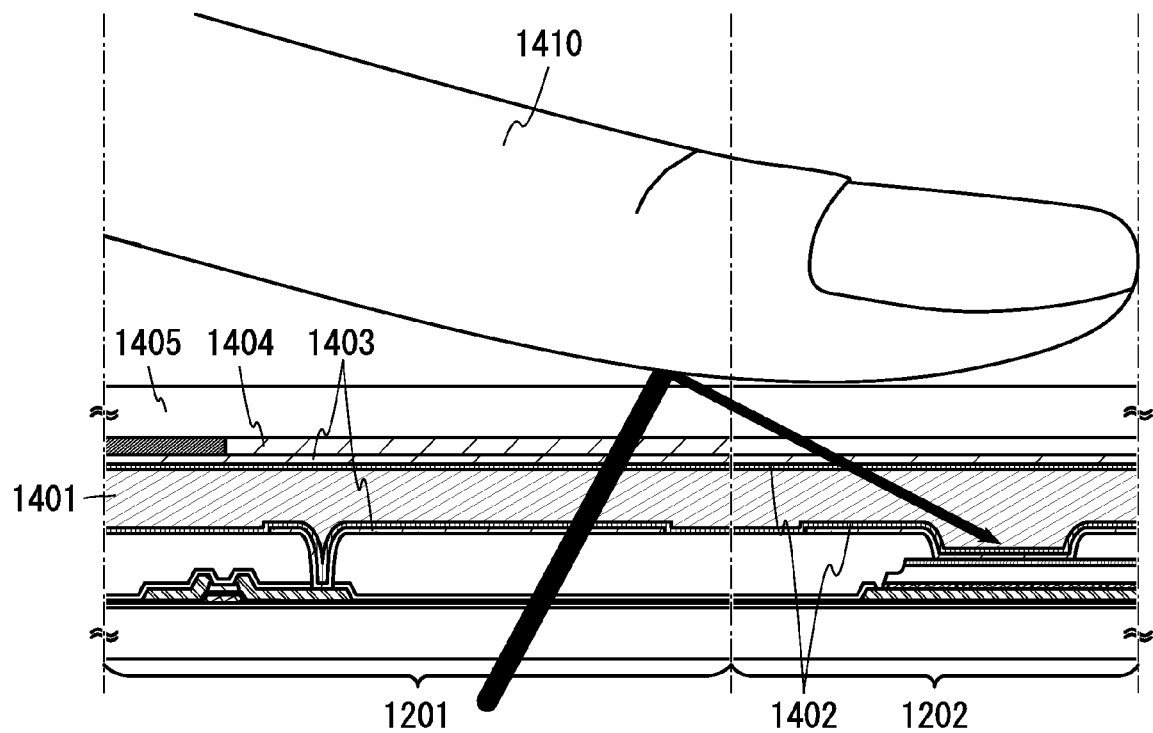

The period B is a period during which an object 1410 to be detected exists over the display element 1201 as illustrated in FIG. 14B, and light (image) output from the display element 1201 with the use of the first display element driver 1221 and the second display element driver 1222 is partly absorbed by the object 1410, the other light enters the photodetector circuit 1202, and a potential (data) (hereinafter, also referred to as a potential D) including the amount of incident light in the period B as data is held in the second signal output circuit 102.

Note that the amount of light entering the photodetector circuit 1202 in the period B is much larger than the amount of incident light in the period A.

After that, the potential C and the potential D are held in all the pixels 1210 in the display portion 1240, and then, a detection signal including the potential C as data and a detection signal including the potential D as data are output from each of the pixels 1210 to the detection signal comparison portion 1260.

Then, in the detection signal comparison portion 1260, two detection signals input from each of the pixels 1210 are compared. In the case where a difference of a predetermined value (which may be determined by a practitioner as appropriate) or more is found, it is judged that the object 1410 exists over the pixel 1210.

Here, the case where the photodetector circuit 1202 includes one photoelectric conversion element and one signal output circuit is described.

In the structure, when data held in the signal output circuit remains in the period A, a potential (data) in the period B cannot be obtained accurately. In other words, since a potential (data) in the period B is added to a potential (data) in the period A, output of a detection signal corresponding to a potential (data) (output operation) and reset of a potential (data) held in the signal output circuit (reset operation) are necessarily performed by the start of the period B.

Therefore, after the end of the period A and before the start of the period B, for example, in the case where an output operation is performed on data obtained in the period A and the object 1410 passes over the display element 1201 in a period during which a reset operation is performed on the data obtained in the period A, whether the object 1410 exists over each pixel 1210 or not cannot sometimes be judged accurately by the detection signal comparison portion 1260, even using data obtained in the period A and data obtained in the period B.

In contrast, in the image display device 1200 described in this embodiment, two signal output circuits (the first signal output circuit 101 and the second signal output circuit 102) are connected to the photoelectric conversion element 100 as illustrated in FIG. 13; thus, turning off the first switching element 121 in the first signal output circuit 101 enables a potential (data) in the period A to be held in the first signal output circuit. Further, only performing a reset operation on the second signal output circuit 102 after the period A enables a potential (data) in the period B to start to be obtained using the photoelectric conversion element 100 and the second signal output circuit 102.

Thus, even in the case where the object 1410 moves extremely quickly, whether the object 1410 exists over each pixel 1210 or not can be judged accurately.

The above is the description of the image display device including the photodetector circuit described in any of the above embodiments.

Although the detection signal comparison portion 1260 is provided in the image display device 1200 so as to be connected to the first photodetector circuit driver 1231 in FIG. 12, the detection signal comparison portion 1260 may be provided in the first photodetector circuit driver 1231. Alternatively, the detection signal comparison portion 1260 may be provided outside the image display device 1200.

This application is based on Japanese Patent Application serial no. 2012-200495 filed with Japan Patent Office on Sep. 12, 2012, the entire contents of which are hereby incorporated by reference.

What is claimed is:

1. A photodetector circuit comprising:
    a photoelectric conversion element;
    a first transistor;
    a second transistor;
    a third transistor; and
    a fourth transistor,
    wherein a gate of the third transistor is electrically connected to a first terminal of the photoelectric conversion element through the first transistor,
    wherein a gate of the fourth transistor is electrically connected to the first terminal of the photoelectric conversion element through the second transistor,
    wherein the first transistor is configured to hold a gate potential of the third transistor in accordance with an amount of light entering the photoelectric conversion element when light is emitted from a light source, and
    wherein the second transistor is configured to hold a gate potential of the fourth transistor in accordance with an amount of light entering the photoelectric conversion element when light is not emitted from the light source.

2. The photodetector circuit according to claim 1,
    wherein the first transistor comprises a channel formation region comprising an oxide semiconductor, and
    wherein the second transistor comprises a channel formation region comprising an oxide semiconductor.

3. The photodetector circuit according to claim 2,
    wherein the photoelectric conversion element is configured to generate first charge corresponding to the gate potential of the third transistor during a first potential generation period where light is emitted from the light source to the photoelectric conversion element,
    wherein the photoelectric conversion element is configured to generate second charge corresponding to the gate potential of the fourth transistor during a second potential generation period where light is not emitted from the light source after the first potential generation period,
    wherein the third transistor is configured to output a signal corresponding to the gate potential of the third transistor during a first output period after the second potential generation period, and
    wherein the fourth transistor is configured to output a signal corresponding to the gate potential of the fourth transistor during a second output period after the first output period.

4. The photodetector circuit according to claim 3,
    wherein the first transistor is configured to hold the gate potential of the third transistor from the first potential generation period to the first output period, and
    wherein the second transistor is configured to hold the gate potential of the fourth transistor from the second potential generation period to the second output period.

5. The photodetector circuit according to claim 2,
    wherein the photoelectric conversion element is configured to generate first charge corresponding to the gate potential of the third transistor during a first potential generation period where light is emitted from the light source to the photoelectric conversion element,
    wherein the photoelectric conversion element is configured to generate second charge corresponding to the gate potential of the fourth transistor during a second potential generation period where light is not emitted from the light source after the first potential generation period,
    wherein the third transistor is configured to output a signal corresponding to the gate potential of the third transistor during an output period after the second potential generation period, and
    wherein the fourth transistor is configured to output a signal corresponding to the gate potential of the fourth transistor during the output period.

6. The photodetector circuit according to claim 5,
    wherein the first transistor is configured to hold the gate potential of the third transistor from the first potential generation period to the output period, and
    wherein the second transistor is configured to hold the gate potential of the fourth transistor from the second potential generation period to the output period.

7. An imaging device comprising:
    a scintillator; and
    a photodetector circuit,
    wherein the photodetector circuit comprising:
        a photoelectric conversion element;
        a first transistor;
        a second transistor;
        a third transistor; and
        a fourth transistor,
    wherein a gate of the third transistor is electrically connected to a first terminal of the photoelectric conversion element through the first transistor,
    wherein a gate of the fourth transistor is electrically connected to the first terminal of the photoelectric conversion element through the second transistor,
    wherein the first transistor is configured to hold a gate potential of the third transistor in accordance with an amount of light entering the photoelectric conversion element from the scintillator when radiation is emitted from a radiation source, and
    wherein the second transistor is configured to hold a gate potential of the fourth transistor in accordance with an amount of light entering the photoelectric conversion element from the scintillator when radiation is not emitted from the radiation source.

8. The imaging device according to claim 7,
    wherein the first transistor comprises a channel formation region comprising an oxide semiconductor, and
    wherein the second transistor comprises a channel formation region comprising an oxide semiconductor.

9. The imaging device according to claim 8,
    wherein the photoelectric conversion element is configured to generate first charge corresponding to the gate potential of the third transistor during a first potential generation period where radiation is emitted from the radiation source to the scintillator,
    wherein the photoelectric conversion element is configured to generate second charge corresponding to the gate potential of the fourth transistor during a second potential generation period where radiation is not emitted from the radiation source after the first potential generation period,
    wherein the third transistor is configured to output a signal corresponding to the gate potential of the third transistor during a first output period after the second potential generation period, and wherein the fourth transistor is configured to output a signal corresponding to the gate potential of the fourth transistor during a second output period after the first output period.

10. The imaging device according to claim 9,
wherein the first transistor is configured to hold the gate potential of the third transistor from the first potential generation period to the first output period, and
wherein the second transistor is configured to hold the gate potential of the fourth transistor from the second potential generation period to the second output period.

11. The imaging device according to claim 8,
wherein the photoelectric conversion element is configured to generate first charge corresponding to the gate potential of the third transistor during a first potential generation period where radiation is emitted from the radiation source to the scintillator,
wherein the photoelectric conversion element is configured to generate second charge corresponding to the gate potential of the fourth transistor during a second potential generation period where radiation is not emitted from the radiation source after the first potential generation period,
wherein the third transistor is configured to output a signal corresponding to the gate potential of the third transistor during an output period after the second potential generation period, and
wherein the fourth transistor is configured to output a signal corresponding to the gate potential of the fourth transistor during the output period.

12. The imaging device according to claim 11,
wherein the first transistor is configured to hold the gate potential of the third transistor from the first potential generation period to the output period, and
wherein the second transistor is configured to hold the gate potential of the fourth transistor from the second potential generation period to the output period.

13. The imaging device according to claim 7, further comprising the radiation source.

14. The imaging device according to claim 13,
wherein the first transistor comprises a channel formation region comprising an oxide semiconductor, and
wherein the second transistor comprises a channel formation region comprising an oxide semiconductor.

15. The imaging device according to claim 14,
wherein the photoelectric conversion element is configured to generate first charge corresponding to the gate potential of the third transistor during a first potential generation period where radiation is emitted from the radiation source to the scintillator,
wherein the photoelectric conversion element is configured to generate second charge corresponding to the gate potential of the fourth transistor during a second potential generation period where radiation is not emitted from the radiation source after the first potential generation period,
wherein the third transistor is configured to output a signal corresponding to the gate potential of the third transistor during a first output period after the second potential generation period, and
wherein the fourth transistor is configured to output a signal corresponding to the gate potential of the fourth transistor during a second output period after the first output period.

16. The imaging device according to claim 15,
wherein the first transistor is configured to hold the gate potential of the third transistor from the first potential generation period to the first output period, and
wherein the second transistor is configured to hold the gate potential of the fourth transistor from the second potential generation period to the second output period.

17. The imaging device according to claim 14,
wherein the photoelectric conversion element is configured to generate first charge corresponding to the gate potential of the third transistor during a first potential generation period where radiation is emitted from the radiation source to the scintillator,
wherein the photoelectric conversion element is configured to generate second charge corresponding to the gate potential of the fourth transistor during a second potential generation period where radiation is not emitted from the radiation source after the first potential generation period,
wherein the third transistor is configured to output a signal corresponding to the gate potential of the third transistor during an output period after the second potential generation period, and
wherein the fourth transistor is configured to output a signal corresponding to the gate potential of the fourth transistor during the output period.

18. The imaging device according to claim 17,
wherein the first transistor is configured to hold the gate potential of the third transistor from the first potential generation period to the output period, and
wherein the second transistor is configured to hold the gate potential of the fourth transistor from the second potential generation period to the output period.

19. A method for driving a photodetector circuit comprising a photoelectric conversion element, a first transistor, a second transistor, a third transistor, and a fourth transistor,
wherein a gate of the third transistor is electrically connected to a first terminal of the photoelectric conversion element through the first transistor,
wherein a gate of the fourth transistor is electrically connected to the first terminal of the photoelectric conversion element through the second transistor, and
wherein the method comprising the steps of:
emitting light from a light source to the photoelectric conversion element during a first potential generation period;
generating a gate potential of the third transistor in accordance with an amount of light entering the photoelectric conversion element while the first transistor is in an on state during the first potential generation period;
emitting no light from the light source to the photoelectric conversion element during a second potential generation period after the first potential generation period;
generating a gate potential of the fourth transistor in accordance with an amount of light entering the photoelectric conversion element while the second transistor is in an on state during the second potential generation period;
outputting a first signal corresponding to the gate potential of the third transistor during a first output period after the second potential generation period;
outputting a second signal corresponding to the gate potential of the fourth transistor during a second output period after the second potential generation period;
holding the gate potential of the third transistor while the first transistor is in an off state after the first potential generation period until the first output period; and holding the gate potential of the fourth transistor while the second transistor is in an off state after the second potential generation period until the second output period.

20. The method for driving the photodetector circuit according to claim 19,
   wherein the second output period is after the first output period.

21. The method for driving the photodetector circuit according to claim 19,
   wherein the light is generated by a scintillator.

* * * * *